(12) United States Patent
Tsunehiro et al.

(10) Patent No.: US 8,898,545 B2
(45) Date of Patent: Nov. 25, 2014

(54) SEMICONDUCTOR STORAGE DEVICE AND CONTROL METHOD OF NONVOLATILE MEMORY

(75) Inventors: Takashi Tsunehiro, Ebina (JP); Akifumi Suzuki, Yokohama (JP); Junji Ogawa, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 281 days.

(21) Appl. No.: 13/512,804

(22) PCT Filed: May 18, 2012

(86) PCT No.: PCT/JP2012/003281
§ 371 (c)(1),
(2), (4) Date: May 30, 2012

(87) PCT Pub. No.: WO2013/171806
PCT Pub. Date: Nov. 21, 2013

(65) Prior Publication Data
US 2013/0311854 A1  Nov. 21, 2013

(51) Int. Cl.
*G11C 29/00* (2006.01)

(52) U.S. Cl.
USPC .......................................... 714/773

(58) Field of Classification Search
CPC ............ G06F 11/1068; G06F 11/1072; G06F 11/1008; G06F 11/1076; G11C 29/00
USPC ........................................ 714/773
See application file for complete search history.

(56) References Cited

U.S. PATENT DOCUMENTS

| 2003/0041299 | A1 | 2/2003 | Kanazawa et al. | |
| 2005/0024974 | A1* | 2/2005 | Noguchi et al. | 365/230.03 |
| 2008/0016430 | A1* | 1/2008 | Yoshida | 714/764 |
| 2009/0228634 | A1* | 9/2009 | Nakamura et al. | 711/103 |
| 2011/0302477 | A1* | 12/2011 | Goss et al. | 714/773 |
| 2012/0099389 | A1* | 4/2012 | Park et al. | 365/200 |

FOREIGN PATENT DOCUMENTS

| JP | 2003-067260 A | 3/2003 |
| JP | 2009-282923 A | 12/2009 |

* cited by examiner

*Primary Examiner* — Albert Decady
*Assistant Examiner* — Enam Ahmed
(74) *Attorney, Agent, or Firm* — Foley & Lardner LLP

(57) ABSTRACT

A memory controller adds the redundant information that is used to correct an error for each of data of a predetermined length and stores the data into the nonvolatile memory in the case in which data is written to the nonvolatile memory, the memory controller reads data and the redundant information that has been added to the data from the nonvolatile memory in the case in which data is read from the nonvolatile memory, and the memory controller corrects an error based on the redundant information in the case in which the data includes an error. The memory controller stores data that is in a basic unit that is a unit of an error correction configured by the data of a predetermined length and the redundant information that is added to the data of a predetermined length into a plurality of predetermined pages in a dispersed manner.

8 Claims, 22 Drawing Sheets

SEMICONDUCTOR STORAGE DEVICE AND CONTROL METHOD OF NONVOLATILE MEMORY

TECHNICAL FIELD

The present invention relates to a semiconductor storage device and a control method of a nonvolatile memory.

BACKGROUND ART

In recent years, a NAND type flash memory has been installed in a memory card, a solid state disk, or the like, and the demand of the flash memory has been increased from year to year. For the NAND type flash memory, the operations in data read and in data write are controlled by a memory controller. A memory controller that is provided with an error correction circuit (ECC circuit) adds the redundant information to data that has been input from a host apparatus and stores that data into the NAND type flash memory in a write of data (see Patent Literature 1 and Patent Literature 2). The memory controller reads data and the redundant information from the NAND type flash memory, detects an error point (an address for instance), and corrects an error of data in a read of data.

The data that is stored into a storage region of the NAND type flash memory is configured by a plurality of blocks. The data of each block is configured by a plurality of pages. For the NAND type flash memory, a write of data and a read of data are executed in a unit of a page. Moreover, for the NAND type flash memory, data is erased in a unit of a block.

The data of one page is divided into a plurality of data that is called a code word. The redundant information for an error correction is added to each code word. A length of data that is input to the ECC circuit and the number of bits of the redundant information depend on the number of bits of code words that are obtained by dividing data of one page of the NAND type flash memory into some data. The number of bits of one page is specified by a data length that can be set to the NAND type flash memory.

CITATION LIST

Patent Literature

PTL 1: Japanese Patent Application Laid-Open Publication No. 2003-67260
PTL 2: Japanese Patent Application Laid-Open Publication No. 2009-282923

SUMMARY OF INVENTION

Technical Problem

For the NAND type flash memory, the number of bits of the redundant information that is added to a code word of a certain length of data is constant. Consequently, in the case in which bit error occurrence rates are different from each other for every page, the error correction ability is too much for a page and an error correction ability is insufficient for another page in some cases.

In the case in which a semiconductor storage device is manufactured, it is necessary that a worst case is considered. Consequently, a length of the redundant information (the number of bits of which an error correction is possible) is decided in accordance with the highest error occurrence rate among an error occurrence rate of each page. However, in this case, since the redundant information that is provided with the excess error correction ability is stored for a page in which an error occurrence rate is low, a storage region of a page is consumed more than is necessary.

It is thought that a longer bit length of the redundant information is allocated to a page in which an error occurrence rate is higher and a shorter bit length of the redundant information is allocated to a page in which an error occurrence rate is lower. However in this case, a memory controller is provided with a plurality of ECC circuits with different correction bit lengths inside. Consequently, a configuration of an error correction circuit of a memory controller is complicated and a cost of the entire semi-conductor storage device is increased unfortunately.

The present invention was made in consideration of the above problems, and an object of the present invention is to provide a semiconductor storage device and a control method of a nonvolatile memory in which the redundant information can be used in an efficient way to execute an error correction processing. Another object of the present invention is to provide a semiconductor storage device and a control method of a nonvolatile memory in which the redundant information can be used in an efficient way by using a dispersion of bit error occurrence rates and the reliability can be improved.

Solution of Problem

In order to solve the above problems of the conventional art, a semiconductor storage device in accordance with the present invention is comprised of a nonvolatile memory that is provided with a plurality of pages and a memory controller that is configured to control a read and a write of data to the nonvolatile memory, the memory controller adds the redundant information that is used to correct an error for each of data of a predetermined length and stores the data into the nonvolatile memory in the case in which data is written to the nonvolatile memory, the memory controller reads data and the redundant information that has been added to the data from the nonvolatile memory in the case in which data is read from the nonvolatile memory, and the memory controller corrects an error based on the redundant information in the case in which the data includes an error, and the memory controller stores data that is in a basic unit that is a unit of an error correction and that is configured by the data of a predetermined length and the redundant information that is added to the data of a predetermined length into a plurality of predetermined pages among the plurality of pages in a dispersed manner in the case in which the data is written.

The memory controller can store the data of a basic unit into a predetermined region in the plurality of predetermined pages in a divided manner.

The plurality of predetermined pages can be selected from the plurality of pages in such a manner that an average value of a bit error occurrence rate that is included in the plurality of predetermined pages is in a predetermined range.

Other objects of the present invention will be clarified by the explanations of the present specification and the accompanying drawings. The explanations of the present specification are just typical examples and do not restrict the claims or examples of the application of the present invention in any sense.

BRIEF DESCRIPTION OF DRAWINGS

FIG. 4 is a block diagram showing a basic configuration of an FM interface and so on.

DESCRIPTION OF EMBODIMENTS

The embodiments for the present invention will be described below in detail with reference to the drawings. In the present embodiments, a NAND type flash memory will be described as an example of a nonvolatile memory. However, a nonvolatile memory is not restricted to a NAND type flash memory and a nonvolatile memory of other kind can also be used. For instance, the present invention can also be applied to a nonvolatile memory of other kind such as a resistance change type RAM (ReRAM), a phase change type RAM (PRAM®), and a magnetic resistance type RAM (MRAM).

The present embodiment utilizes a technical characteristic of a nonvolatile memory in which a bit error occurrence rate is different from each other for every page. In the present embodiment, a code word as an example of "data that is in a basic unit that is a unit of an error correction" is written to a plurality of pages in a dispersed manner. By this configuration, a bit error occurrence rate that is related to a code word becomes an average value of a bit error rate of a plurality of pages. As a result, it is not necessary that ECC (Error Check and Correct) circuits of a plurality of types are prepared, and the error correction ability can be implemented in an efficient way only by using an ECC circuit of one type.

A part of a page in which a bit error occurrence rate is high is used as one of a storage destination of a code word and a part of a page in which a bit error occurrence rate is low is used as other one of a storage destination of a code word for instance. In this case, a bit error occurrence rate for the entire code words is an average value of a high bit error occurrence rate and a low bit error occurrence rate. Consequently, in the case in which an ECC circuit that is corresponded to the average bit error occurrence rate, the error correction ability can be obtained without excess and deficiency.

Consequently, it is preferable that a plurality of predetermined pages is selected in such a manner that an average value of a bit error occurrence rate that is included in the plurality of predetermined pages is in a predetermined range and a code word is written to the plurality of predetermined pages in a divided manner. The appropriate error correction ability can be implemented only by using an ECC circuit that is corresponded to the predetermined range.

Embodiment 1

The examples of embodiments for the present invention will be described below in detail with reference to the drawings. A basic circuit configuration and a basic data writing method will be described in the first place, and a particular circuit configuration and a particular data writing method will be described in the present embodiment in the next place.

Figure 1:
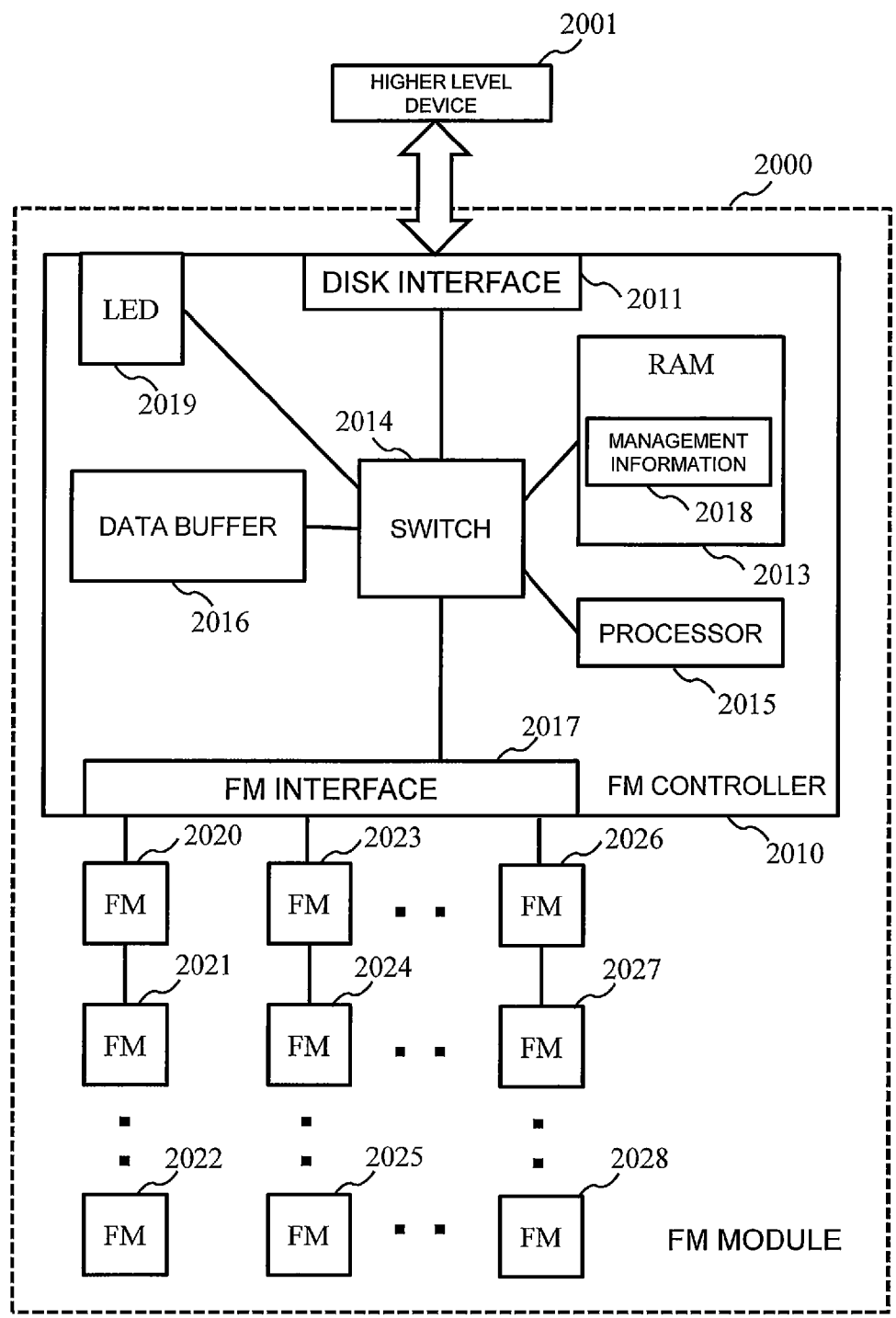
FIG. 1 is an overall view showing an information processing system that is provided with a semiconductor storage device in accordance with an embodiment of the present invention.

FIG. 1 shows an overall configuration of a system that includes a flash memory module 2000 as a semiconductor storage device. A flash memory is abbreviated to as an FM in some cases in the following. The present system is configured by coupling the FM module 2000 and a higher level device 2001 to each other in such a manner that a two-way communication is allowed. The higher level device 2001 is a device that is configured to read or write data to the FM module 2000 and is configured as a mainframe, a server, a personal computer, a digital camera, a printer, a mobile phone, a personal digital assistance, and a picture recorder for instance.

The FM module 2000 is provided with at least one FM controller 2010 and a plurality of FMs 2020 to 2028. It is also possible that a plurality of FM controllers 2010 is formed and one FM controller and the other FM controller back up to each other.

The FM controller 2010 is provided with a disk interface 2011, a RAM (Random Access Memory) 2013, and a switch circuit 2014, a microprocessor (hereafter referred to as a processor) 2015, a data buffer 2016, an FM interface 2017, and an LED lamp 2019 for instance.

The disk interface 2011 is a communication circuit that is configured to communicate with the higher level device 2001. The RAM 2013 is configured to store the information 2018 that is configured to be used for a management of the FMs 2020 to 2028 and a computer program. The switch circuit 2014 is configured to couple the circuits 2011, 2013, 2015, 2016, 2017, and 2019 to each other in the FM controller 2010.

The processor 2015 is configured to execute a predetermined computer program that has been stored into the RAM 2013 and to control the overall operation of the FM module 2000. The data buffer 2016 is a memory that is used in the case in which data is input or output to the FMs 2020 to 2028.

The FM interface 2017 is a communication circuit that is configured to communicate with the FMs 2020 to 2028. The LED lamp 2019 is configured to notify the outside of an operation situation of the FM module 2000.

In the case in which an access request is transmitted from the higher level device 2001 to the FM module 2000, the access request is received by the disk interface 2011. The processor 2015 receives the access request by using the switch circuit 2014, the RAM 2013, the management information 2018, and the data buffer 2016 for instance.

The processor 2015 interprets the access request that has been received. The interpretation of the access request means a determination of whether the access request is a read request or a write request or an identification of an FM of an access target. The processor 2015 accesses an FM that is identified by the access request via the FM interface 2017 and reads or writes data.

In the case of a read request, the processor 2015 transmits data that has been read from an FM to the higher level device 2001 via the data buffer 2016 and the disk interface 2011. In the case of a read request, the processor 2015 writes data that has been received from the higher level device 2001 to the FM and notifies the higher level device 2001 of the write result. In the case in which an erasing request is issued from the higher level device 2001, the processor 2015 saves data in an erasing target block into a page in other block and then erases data of the erasing target block.

In a process of a processing of a request from the higher level device 2001, the FM controller 2010 can display a status by lighting or blinking the LED lamp 2019.

Figure 2:
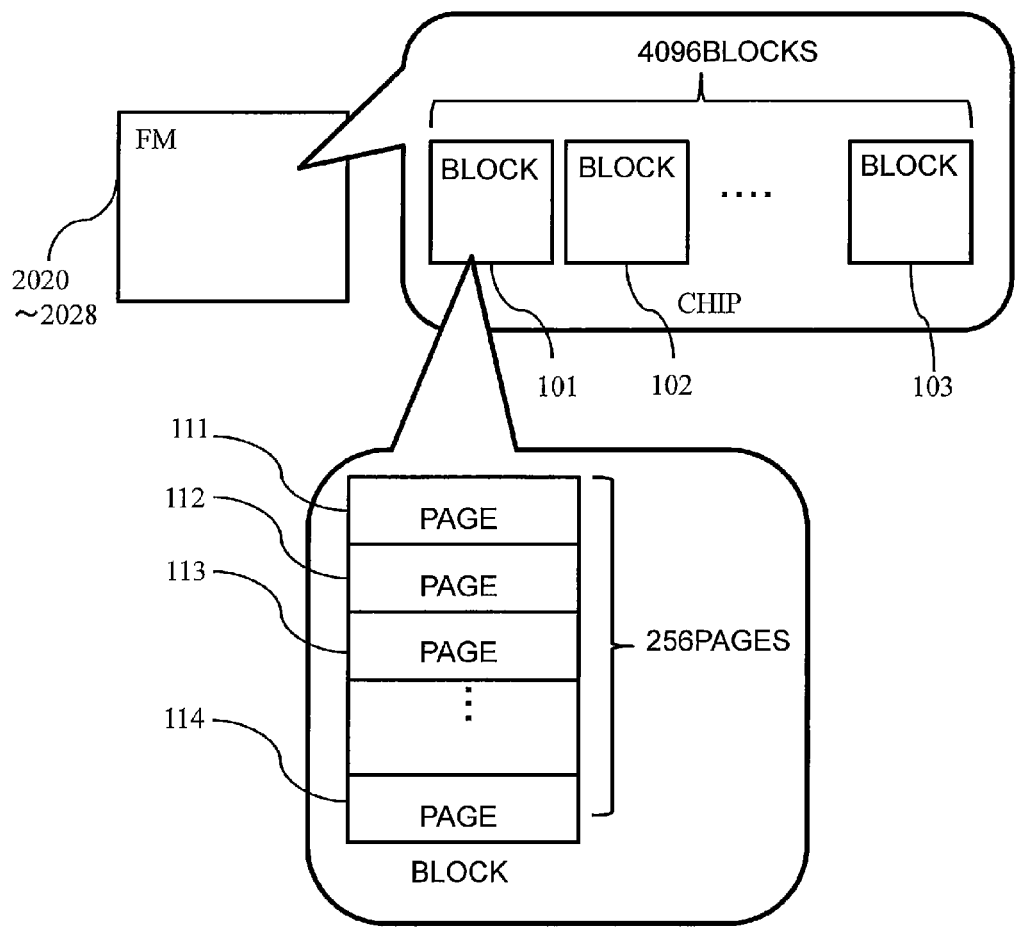
FIG. 2 is an explanatory drawing showing a relationship between a block in an erasing unit and a page in a read/write unit for a NAND type flash memory.

The configuration outline of FMs 2020 to 2028 of a NAND type will be described with reference to FIG. 2. One FM is composed of a plurality of blocks 101, 102, and 103. FIG. 2 shows an example in which 4096 blocks exist. A block is a unit that can be erased all at once. One block 101 is configured by a plurality of pages 110, 111, 112, 113, and 114. FIG. 2 shows an example in which one block is configured by 256 pages. A page is a unit of a write and a read.

Figure 3:
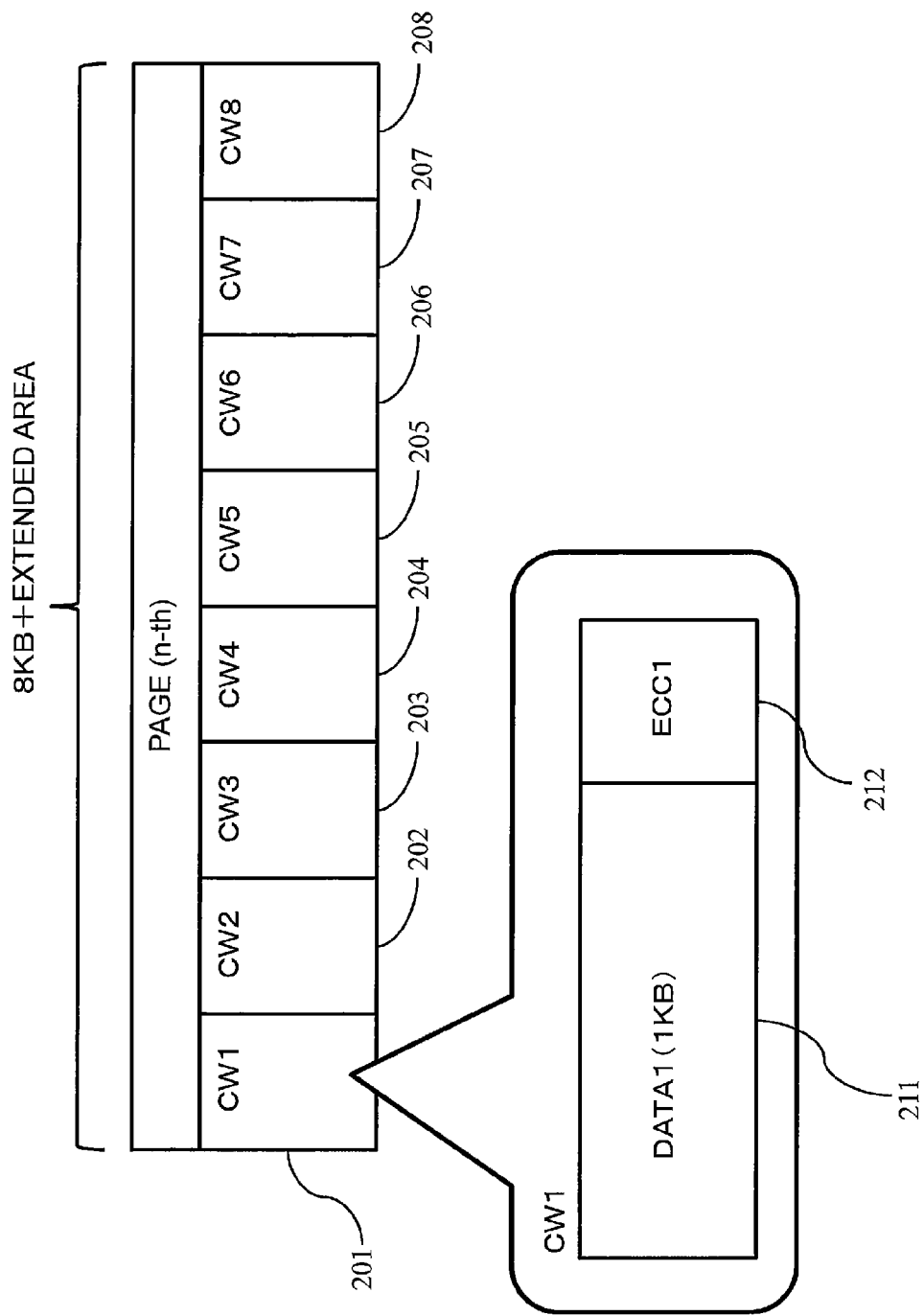
FIG. 3 is an explanatory drawing showing a relationship between a page and a code word.

FIG. 3 shows a storage configuration of a page. A storage region of one page is divided into a plurality of data units and is managed. The data unit is called a code word (CW). In FIG. 3, one page is divided into eight code words of CW1 (201), CW2 (202), CW3 (203), CW4 (204), CW5 (205), CW6 (206), CW7 (207), and CW8 (208) for a management. One code word is configured by data 211 and an ECC 212 that is configured to check data.

One page is divided into eight CWs in the example of FIG. 3. However, one page can also be divided into CWs of an appropriate number in accordance with a system.

In the case in which the data 211 (DATA 1) is written to an FM, an error correction circuit (an ECC circuit) 302 described later generates an ECC 1 from the DATA 1 and stores the ECC 1 in a predetermined part on the FM. In the case in which the data is read from an FM, the ECC circuit 302 executes a predetermined operation by using the DATA 1 and the ECC 1 and judges whether or not an error correction is required. In the case in which it is decided that an error correction is required, the ECC circuit 302 corrects the error.

Figure 4:
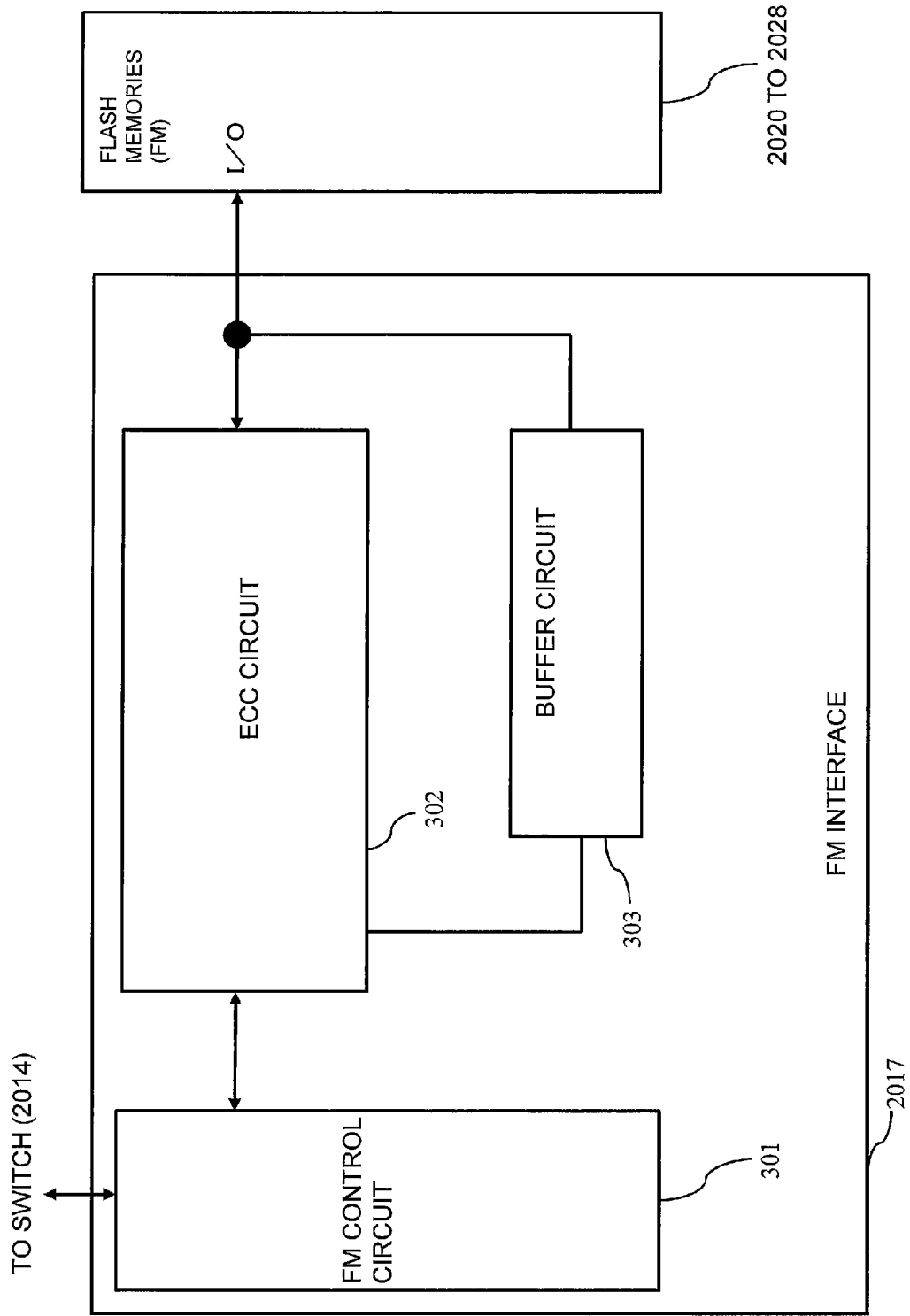

FIG. 4 shows a configuration example of an FM interface 2017. The FM interface 2017 is provided with an FM control circuit 301, an ECC circuit 302, and a buffer circuit 303 for instance. The FM control circuit 301 controls a data transmission with an FM. The ECC circuit 302 executes an identification of an error point and a correction of an error by using an ECC. The buffer circuit 303 stores data or an ECC on a temporary basis.

An access request from the higher level device 2001 is input to the FM control circuit 301 of the FM interface 2017 via the switch 2014. The FM control circuit 301 divides the access request that has been received into a command and data that are corresponded to the FMs 2020 to 2028 of an access target for a control.

A description will be executed while focusing on data here. For the data that is written from the higher level device 2001, the redundant information for an error correction (ECC) is generated by the ECC circuit 302. In other words, in the case in which data is input from the FM control circuit 301 to the ECC circuit 302, an ECC that is related to the data is generated. The FM control circuit 301 inputs data to the ECC circuit 302 and inputs data to the buffer circuit 303 simultaneously. By this configuration, the FM interface 2017 adds an ECC that is output from the ECC circuit 302 to data that is output from the buffer circuit 303 to generate a code word (see FIG. 3). The FM interface 2017 sends a code word to an FM of a write destination.

The following describes the case in which the FM interface 2017 reads data from an FM. The ECC circuit 302 receives data (DATA 1 (211) shown in FIG. 3) from an FM of a read destination and calculates an ECC again based on the data. Moreover, the ECC circuit 302 receives a code word (CW 1) from an FM of a read destination and checks an ECC 1 in the code word and an ECC that has been calculated again. The ECC circuit 302 judges whether or not an error (a bit error) occurs in the data that has been read based on the checking result of an ECC. In the case in which an error has occurred, the ECC circuit 302 corrects the error and sends the data to the FM control circuit 301.

Data that has been received from an FM is stored into the buffer circuit 303 on a temporary basis in order to correct an error. The buffer circuit 303 is used to calculate an error position and to send the corrected data to the FM control circuit 301.

Only one code word CW1 (201) has been described above. However, since each of FMs 2020 to 2028 is written in a unit of one page, a processing equivalent to the above processing is executed for each of other code words CW2 (202) to CW8 (208) that configure one page.

Figure 5:
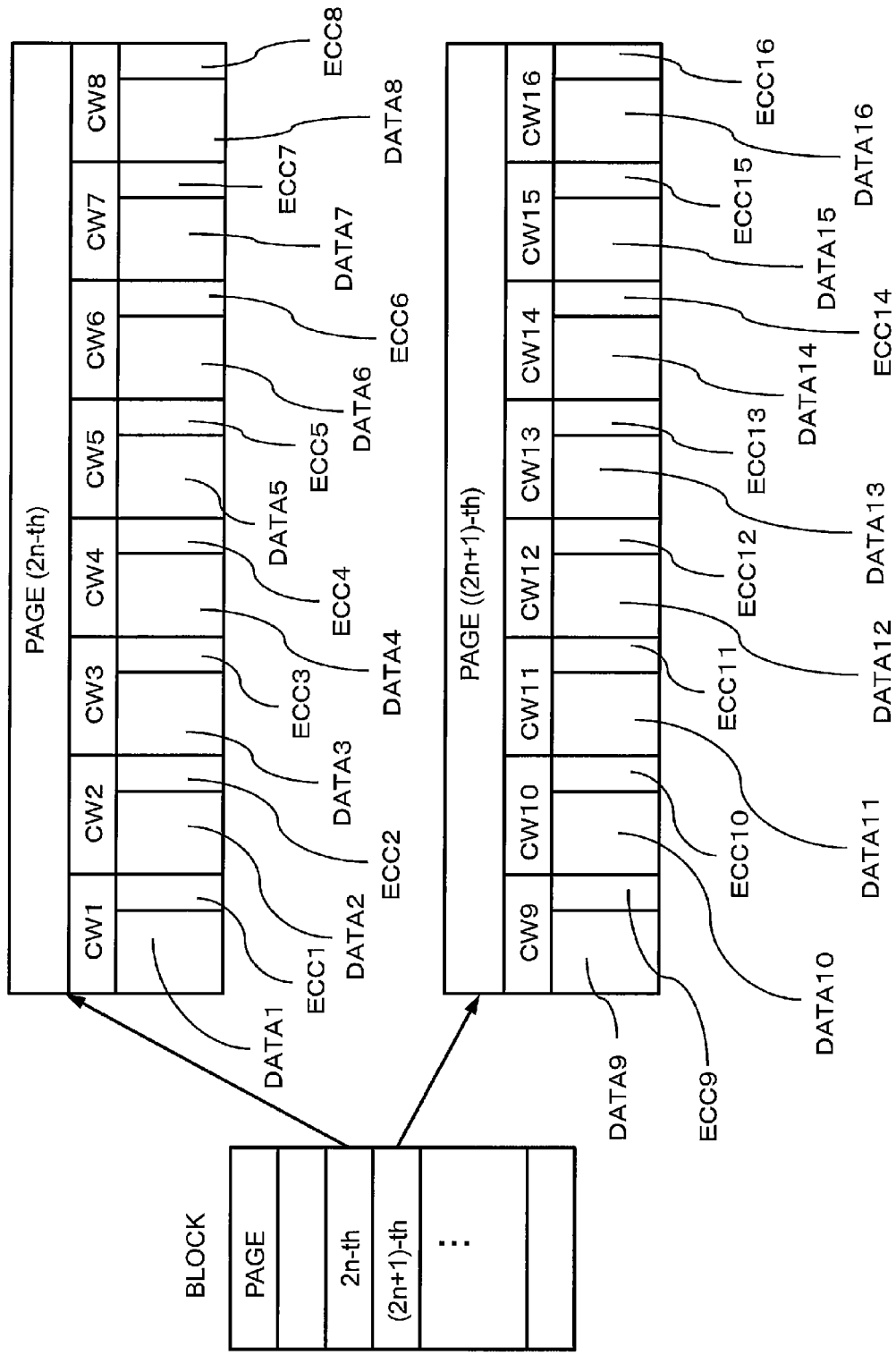
FIG. 5 is an explanatory drawing showing a case in which a code word is stored into continuous two pages.

FIG. 5 shows a case in which a code word is stored continuously into pages without a divide thereof. As described above, it is known that a bit error occurrence rate is different from each other for every page. A bit error occurrence rate is different from each other for the 2n-th page and the (2n+1)-th page.

Consequently, an error correction ability that is required for the code words CW1 to CW8 that are disposed in the 2n-th page and an error correction ability that is required for the code words CW9 to CW16 that are disposed in the (2n+1)-th page are different from each other.

Consequently, it is thought that an error correction ability of the redundant information that is added to the code words CW1 to CW8 that are disposed in the 2n-th page and an error correction ability of the redundant information that is added to the code words CW9 to CW16 that are disposed in the (2n+1)-th page are changed in response to a difference of a bit error occurrence rate.

For instance, the following considers the case a bit error occurrence rate of the 2n-th page is lower than a bit error occurrence rate of the (2n+1)-th page. In this case, an error correction ability of the redundant information that is added to the code words CW1 to CW8 that are disposed in the 2n-th page can be set to be lower than an error correction ability of the redundant information that is added to the code words CW9 to CW16 that are disposed in the (2n+1)-th page.

An error correction ability of the redundant information (ECC) is determined based on the number of bits (a data length). The redundant information that is provided with the lower correction ability can be implemented by a less data length. Since a data length of the redundant information of the 2n-th page can be less, in the case in which an ECC circuit that is suitable for a bit error occurrence rate of the 2n-th page is prepared, the extended information can be added to an unused region of the 2n-th page. In this case, it is necessary that a plurality of ECC circuits that are provided with different error correction abilities is prepared in accordance with a difference of a bit error occurrence rate.

On the other hand, in the case in which one ECC circuit is prepared in accordance with a page that is provided with the highest bit error occurrence rate, an error correction ability is excessive for the code words CW1 to CW8 that are stored into a page that is provided with a low bit error occurrence rate, and a storage region of a page is used more than is necessary.

While focusing on such problems, the necessary error correction ability can be obtained only with an ECC circuit of one type by disposing a code word while using a technical characteristic in which a bit error occurrence rate is different from each other for every page in the present embodiment.

In the present embodiment, as described later, parts of a region are extracted from continuous pages that are provided with different bit error occurrence rates and a region of a code word is configured by combining the parts that have been extracted. In other words, a part that is extracted from a page that is provided with a relatively low bit error occurrence rate and a part that is extracted from a page that is provided with a relatively high bit error occurrence rate are combined to be grouped together, and a code word is stored into a region that has been grouped.

In the case in which a code word is configured by collecting parts from pages that are provided with different bit error occurrence rates as described above, a bit error occurrence rate of a region that configures the code word is an average value of a plurality of original bit error occurrence rates. The highest value of a bit error occurrence rate of the code word is less than the highest value of a bit error occurrence rate of each page that provides a storage region to the code word.

In the present embodiment as described above, pages that are provided with different bit error occurrence rates are combined to configure a region for storing a code word. Consequently, a bit error occurrence rate of a region of a code word can be averaged. As a result in the present embodiment, the necessary error correction ability can be obtained by a configuration in which the redundant information of the same data length is added to each code word and one common ECC circuit is configured.

Figure 6:
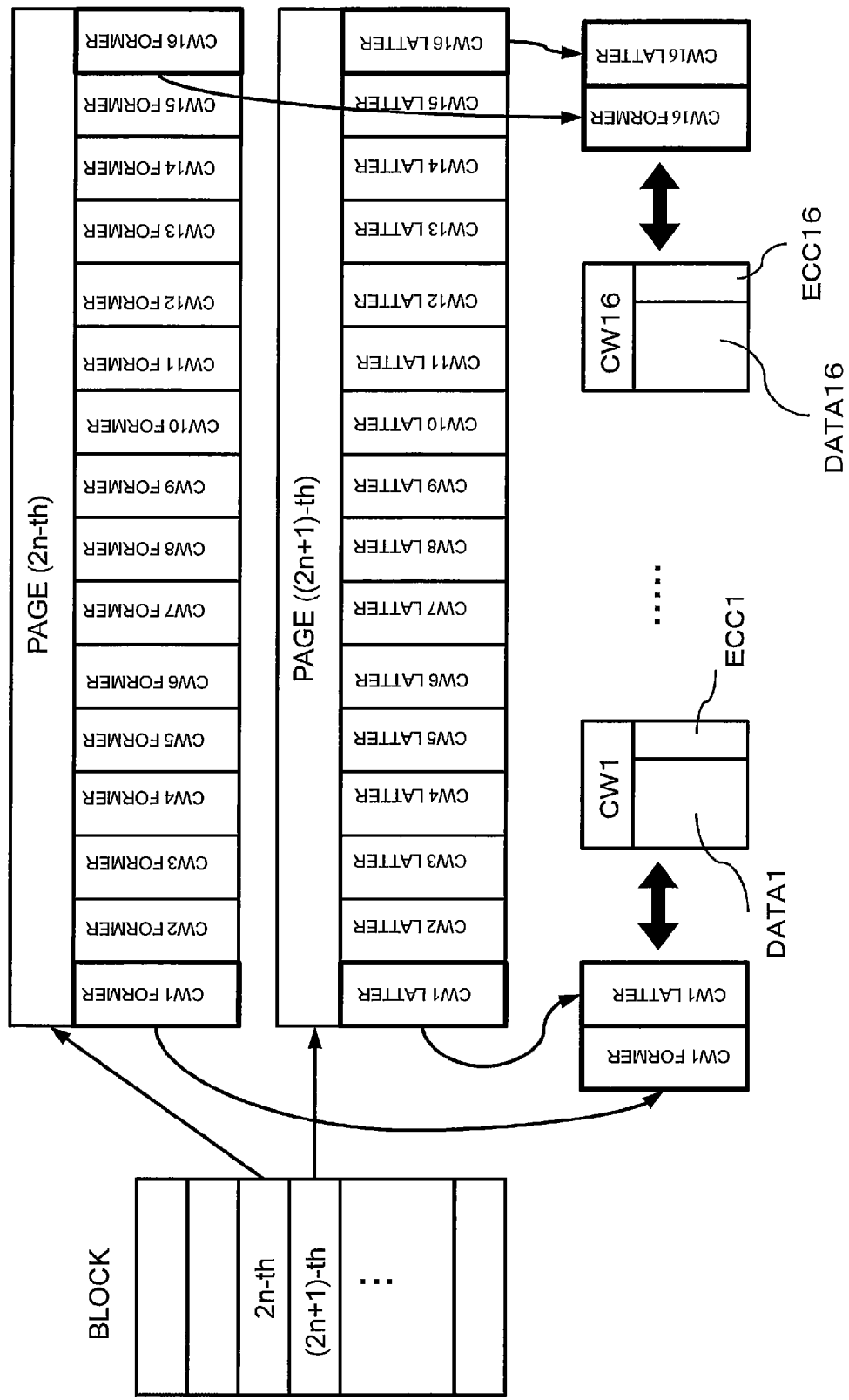
FIG. 6 is an explanatory drawing showing a case in which a code word is divided and stored in a plurality of pages.

FIG. 6 shows a code word that is peculiar to the present embodiment. The data of the former half part of each of the code words CW1 to CW 16 is stored into the 2n-th page. The data of the latter half part of each of the code words CW1 to CW 16 is stored into the (2n+1)-th page. In the case in which the former half part and the latter half part that are corresponded to each other are coupled to each other, one code word is configured.

In FIG. 6 for instance, in the case in which the former half part "CW1 former" of the code word CW1 and the latter half part "CW1 latter" of the code word CW1 are coupled to each other to make one piece, a code word CW1 is configured. In the figure, the former half part is abbreviated to as "former" and the latter half part is abbreviated to as "latter". Other code words CW2 to CW 16 are configured in a similar manner.

The example of FIG. 6 shows the case in which one code word is allocated to the continuous two pages 2n and 2n+1. However, the present invention is not restricted to this case. One code word can also be divided and allocated to the continuous three or more pages, or one code word can also be divided and allocated to a plurality of discontinuous pages. Moreover, a code word can also be dispersed and disposed by using all pages in one block. Each page in the same block is provided with different physical characteristics, and the usage thereof is not the same. Consequently, a bit error occurrence rate of each page is different from each other. Therefore, a predetermined part can be collected from pages that are provided with different bit error occurrence rates to configure a region of a code word.

Figure 7:
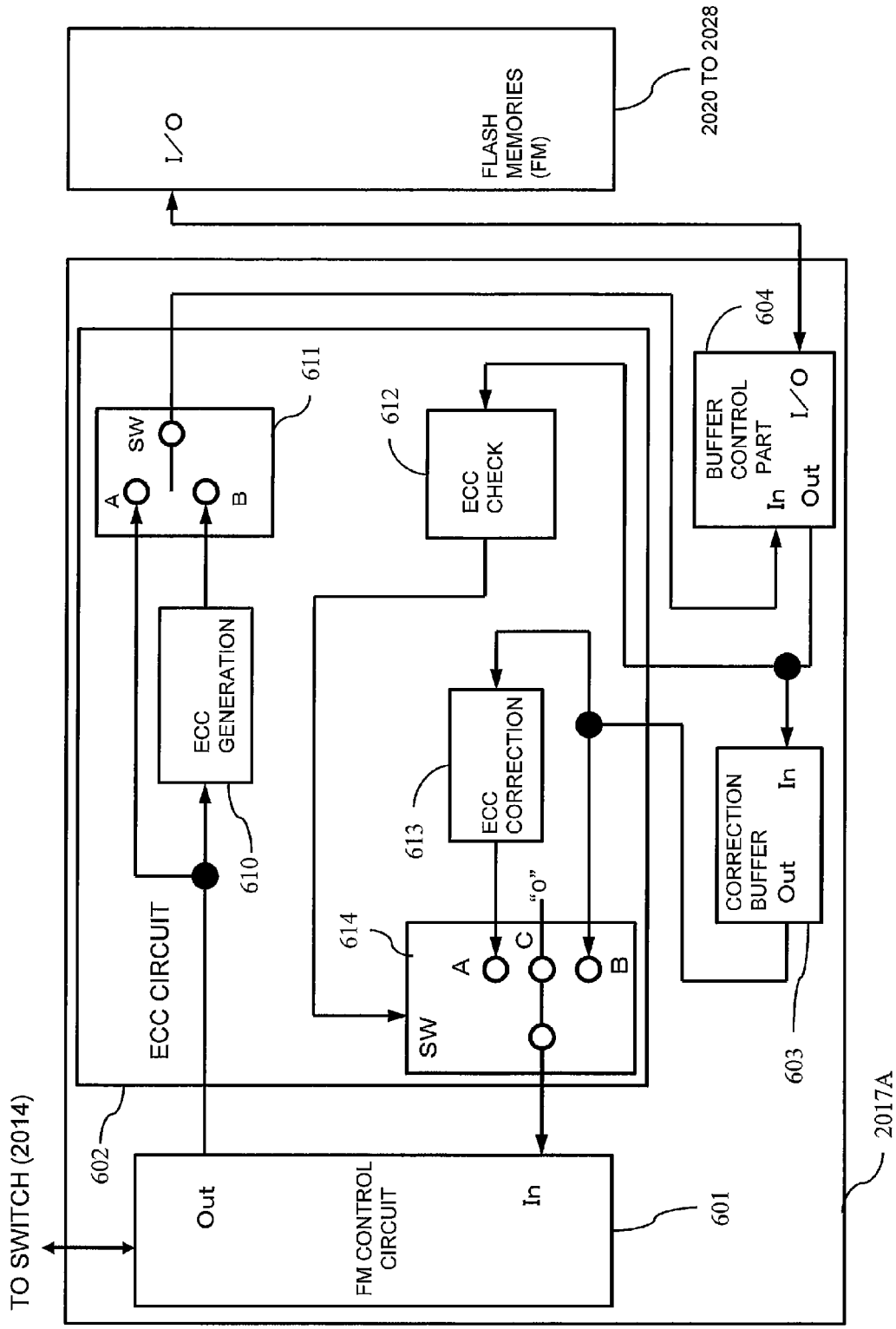
FIG. 7 is a block diagram showing the detail of a main section of a memory controller.

FIG. 7 is a circuit configuration example of the FM interface 2017A that is corresponded to a code word configuration shown in FIG. 6.

The FM interface 2017A is provided with an FM control circuit 601, an ECC circuit 602, a correction buffer 603, and a buffer control part 604 for instance.

The FM control circuit 601 controls a data transmission with an FM. The ECC circuit 602 executes an identification of an error point and a correction of an error by using an ECC. The details of the ECC circuit 602 will be described later.

An input of the correction buffer 603 is coupled to an output of the buffer control part 604. The correction buffer 603 is a memory region that is configured to store a code word that is input from the buffer control part 604 on a temporary basis. The buffer control part 604 controls a data transmission between the ECC circuit 602 or the correction buffer 603 and the FMs 2020 to 2028. A data input/output port (I/O) of the buffer control part 604 is coupled to an input/output port of the FMs 2020 to 2028. An output terminal of a writing switch 611 is coupled to an input of the buffer control part 604. The buffer control part 604 receives data that configures a code word or the redundant information from the writing switch 611. An output of the buffer control part 604 is input to an ECC check part 612 and the correction buffer 603.

The configuration of the ECC circuit 602 will be described in the following. The ECC circuit 602 is provided with an ECC generation part 610, a writing switch 611, an ECC check part 612, an ECC correction part 613, and a reading switch 614 for instance. In the figure, "part" is omitted in some cases in such a manner that an "ECC generation part" is referred to as an "ECC generation".

The ECC generation part 610 is a function (or a circuit, the same shall apply hereinafter) that is configured to generate the redundant information (ECC) that is corresponded to data in the case in which the data is written to an FM. An input of the ECC generation part 610 is coupled to an output of the FM control circuit 601. An output of the ECC generation part 610 is coupled to the other input terminal (B) of the writing switch 611.

The writing switch 611 is a function that is configured to select any one of a data part (DATA 1 to 16) and the redundant information (ECC 1 to 16) that has been generated among the code word (CW1 to CW16) of a write target and to transmit the selected one to the buffer control part 604. One input terminal (A) of the writing switch 611 is coupled to an output of the FM control circuit 601. The other input terminal (B) of the writing switch 611 is coupled to an output of the ECC generation part 610. The output terminal of the writing switch 611 is coupled to an input of the buffer control part 604.

The ECC check part 612 is a function that is configured to check whether or not data that is read has an error in the case in which the data is read from an FM. An output of the buffer control part 604 is coupled to an input of the ECC check part 612. An output of the ECC check part 612 is used as a switching signal of a reading switch 614.

The ECC correction part 613 is a function that is configured to correct data in which an error has been detected by using the redundant information. An input of the ECC correction part 613 is coupled to an output of the correction buffer 603. An output of the ECC correction part 613 is coupled to a first input terminal (A) of the reading switch 614.

The reading switch 614 is a function that is configured to select only data (DATA 1 to 16) from a code word and to send the data to the FM control circuit 601. One input terminal (A) of the reading switch 614 is coupled to an output of the ECC correction part 613 as described above. The other input terminal (B) of the reading switch 614 is coupled to an output of the correction buffer 603. The common terminal (C) of the reading switch 614 generates a value "0". An output terminal of the reading switch 614 is coupled to an input of the FM control circuit 601.

Figure 8:
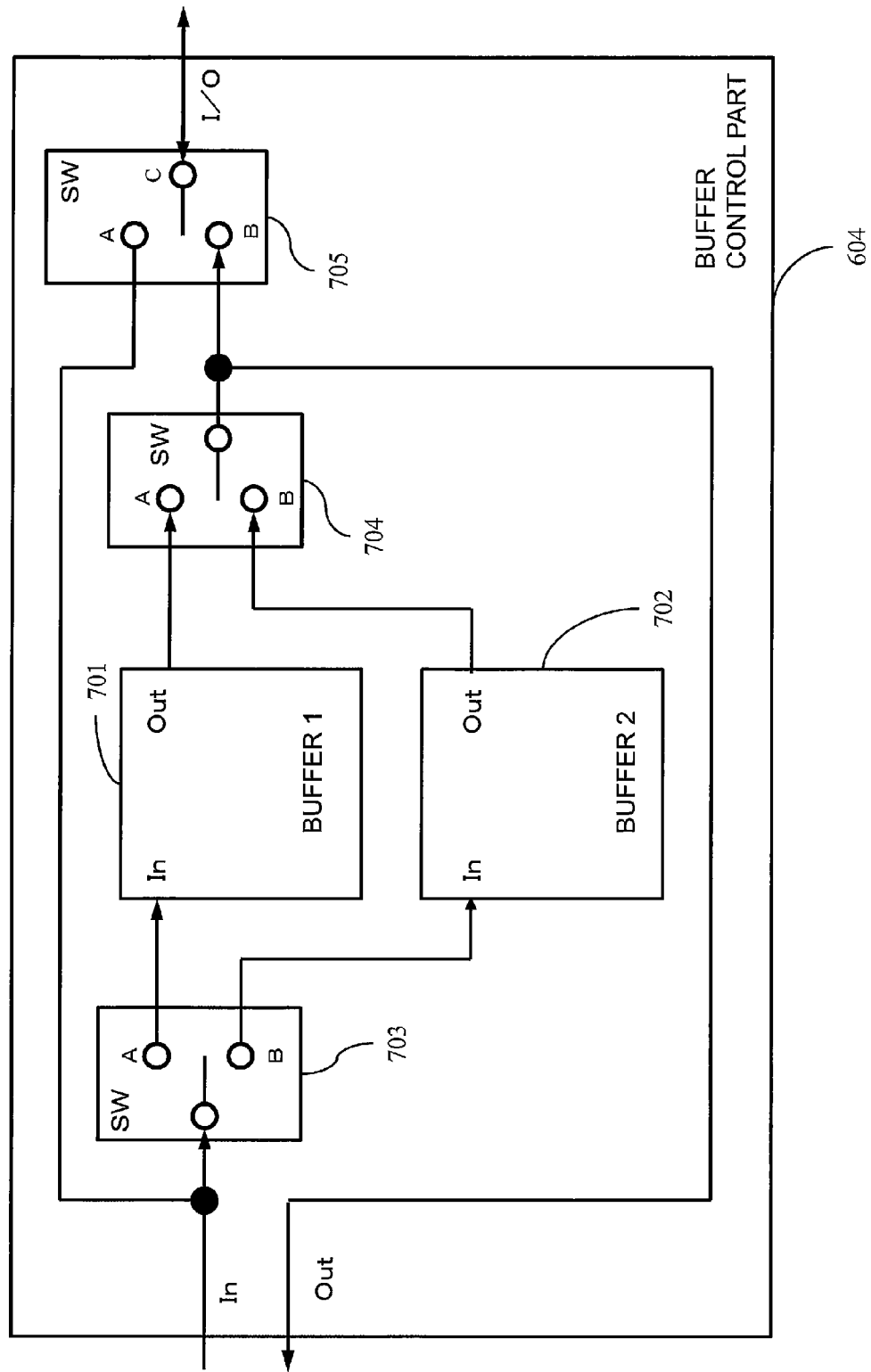
FIG. 8 is a block diagram showing the buffer control part.

FIG. 8 shows the details of the buffer control part 604 of FIG. 7. The buffer control part 604 is configured to write a code word in which data (DATA 1 to 16) that has been input from the FM control circuit 601 and the redundant information (ECC 1 to 16) that has been generated by the ECC circuit 602 are combined to the 2n-th page and the (2n+1)-th page separately.

The buffer control part 604 is provided with a former half buffer 701, a latter half buffer 702, a first switch 703, a second switch 704, and a third switch 705 for instance. As described in FIG. 6, it is necessary that only a former half part of each of the code words CW 1 to 16 is collected and is written to the 2n-th page. Consequently, the former half buffer 701 stores only a former half part of a code word for one page.

It is necessary that only a latter half part of each of the code words CW 1 to 16 is collected and is written to the (2n+1)-th page. Consequently, the latter half buffer 702 stores only a latter half part of a code word for one page.

The first switch 703 is formed to select any one of a former half part or a latter half part of a code word that is input from the ECC circuit 602. In the case in which an output terminal (A) of the first switch 703 is selected, a code word that is input from the ECC circuit 602 is input to the former half buffer 701. In the case in which an output terminal (B) of the first switch 703 is selected, a code word that is input from the ECC circuit 602 is input to the latter half buffer 702. Consequently, by switching the first switch 703 at an appropriate timing, a former half part of a code word can be stored into the former half buffer 701 and a latter half part of a code word can be stored into the latter half buffer 702.

A former half part of a code word is a part on a front side in the case in which the entire code word is divided in half. A latter half part of a code word is a part on a rear side in the case in which the entire code word is divided in half.

The second switch 704 is configured to switch the writing of data in the former half buffer 701 in which only a former half part of a code word is collected to a predetermined FM of a write target and the writing of data and the redundant information in the latter half buffer 702 in which only a latter half part of a code word is collected to an FM of a write target.

One input terminal (A) of the second switch 704 is coupled to an output of the former half buffer 701. The other input terminal (B) of the second switch 704 is coupled to an output of the latter half buffer 702. An output terminal (A) of the second switch 704 is coupled to the other input terminal (B) of the third switch 705. In the case in which one input terminal (A) is selected, data of one page that is configured by only a former half part of a code word is input to the other input terminal (B) of the third switch 705. In the case in which the other input terminal (B) is selected, data of one page that is configured by only a latter half part of a code word is input to the other input terminal (B) of the third switch 705. In the case in which the second switch 704 is in a neutral position and neither one input terminal (A) nor the other input terminal (B) is selected, data or the redundant information is not transmitted between the second switch 704 and the third switch 705.

The third switch 705 is configured to switch an execution of a data processing in writing data and an execution of a data processing in reading data. An output terminal (A) of the third switch 705 can directly receive an output (a code word) from the ECC circuit 602. The other input terminal (B) of the third switch 705 is coupled to an output of the second switch 704. Moreover, the other input terminal (B) of the third switch 705 is coupled to an input side of the ECC check part 612 and an input side of the correction buffer 603 as an output of the buffer control part 604 as shown in FIG. 7.

The data processing timing in the case in which data is written to a predetermined FM will be described with reference to FIG. 9A, FIG. 9B, FIG. 9C, and FIG. 9D while using the above described circuit shown in FIG. 7 and FIG. 8.

FIG. 9A, FIG. 9B, FIG. 9C, and FIG. 9D show a flow in the case in which data of two pages (a 2n-th page and a (2n+1)-th page) is written to an FM. In the figures, "DATA" is abbreviated to as "D" and "ECC" is abbreviated to as "EC".

The data (DATA 1 to 16) of two pages is output from an output of the FM control circuit 601. The data (DATA1) is output at a timing T1. The data (DATA1) is input to the ECC generation part 610. The ECC generation part 610 calculates and outputs the redundant information (ECC1) for the data (DATA1).

The SW 611 selects one input terminal (A) at a timing in which the data (DATA1) is output and selects the other input terminal (B) at a timing in which the redundant information (ECC1) is output. The first switch 703 in the buffer control part 604 selects one input terminal (A) and writes the input data to the former half buffer 701 at a timing in which the former half part of a code word is selected. The first switch 703 selects the other input terminal (B) and writes the input data to the latter half buffer 702 at a timing in which the latter half part of a code word is selected.

Consequently, only the former half part of a code word CW1 of a write target is written to the former half buffer 701, and only the latter half part of the code word CW1 is written to the latter half buffer 702. In the present embodiment, one code word is divided in half and allocated to the predetermined regions of two pages. As a result, the former half part of a code word is configured by only data and the latter half part of a code word is configured by the remainder of data and the redundant information (ECC).

Figure 9A:
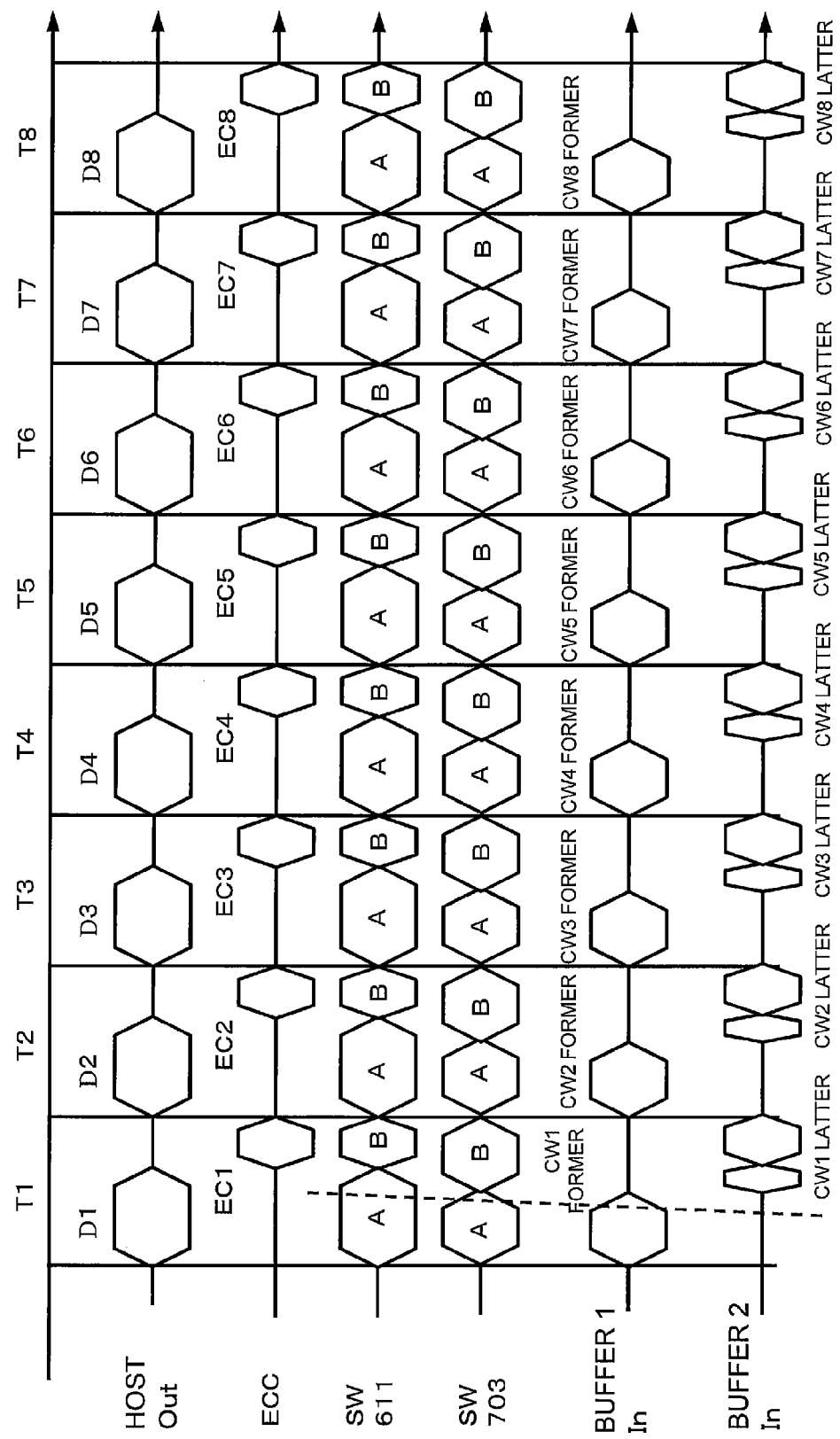
FIG. 9A is a time chart showing a timing in which data that has been received from a host apparatus is written to a buffer in an ECC circuit.
Figure 9B:
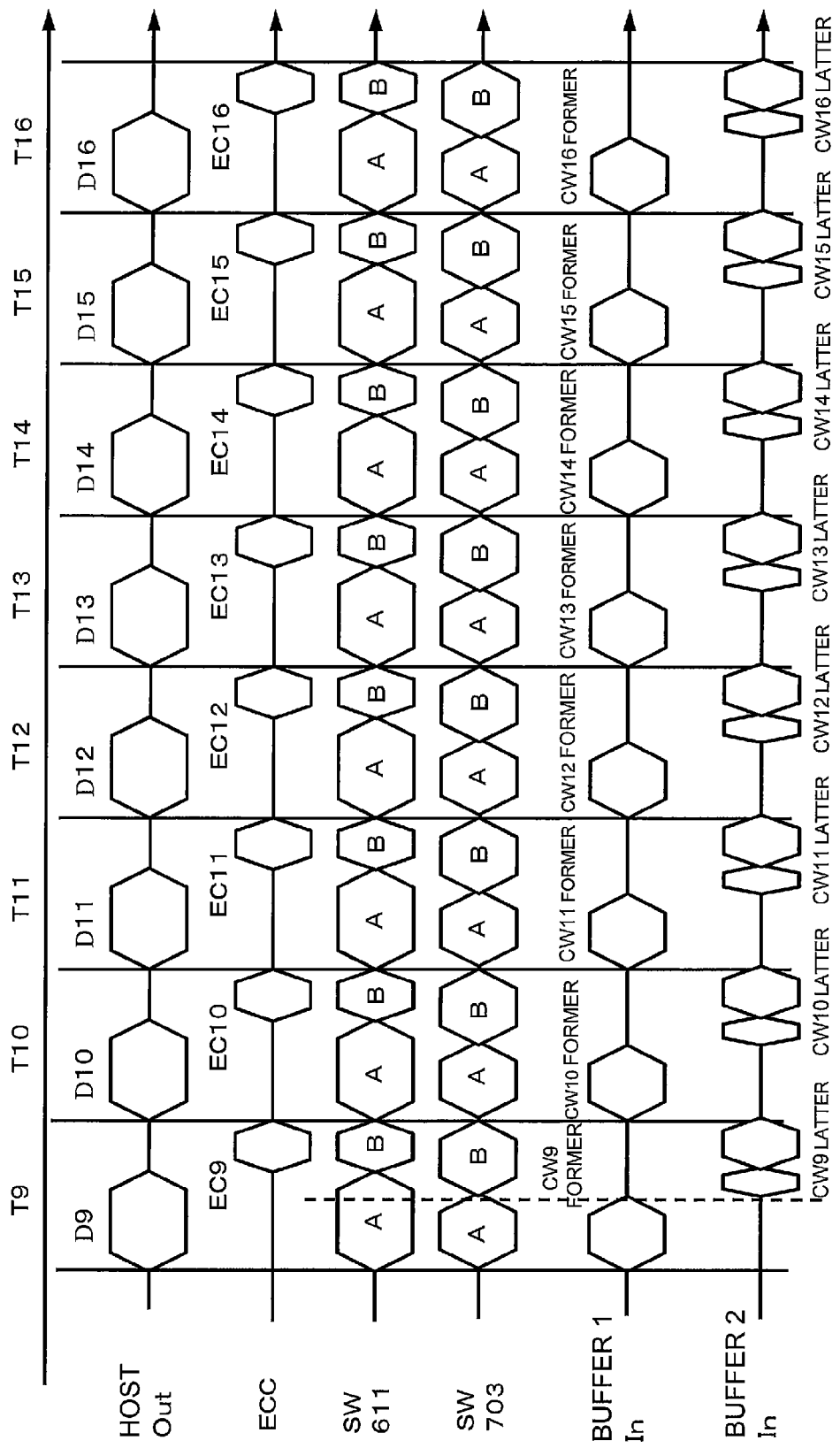
FIG. 9B is a time chart that is continuous from FIG. 9A.

A processing that is similar to that described for a code word that includes the data (DATA1) is repeated in each of the periods from a timing T1 of FIG. 9A to a timing T16 of FIG. 9B. By this configuration, only former half parts of the code words CW1 to CW16 can be collected and stored into the former half buffer 701, and only latter half parts of the code words CW1 to CW16 can be collected and stored into the latter half buffer 702. As a result, a preparation of writing to the 2n-th page and the (2n+1)-th page is all set.

Figure 9C:
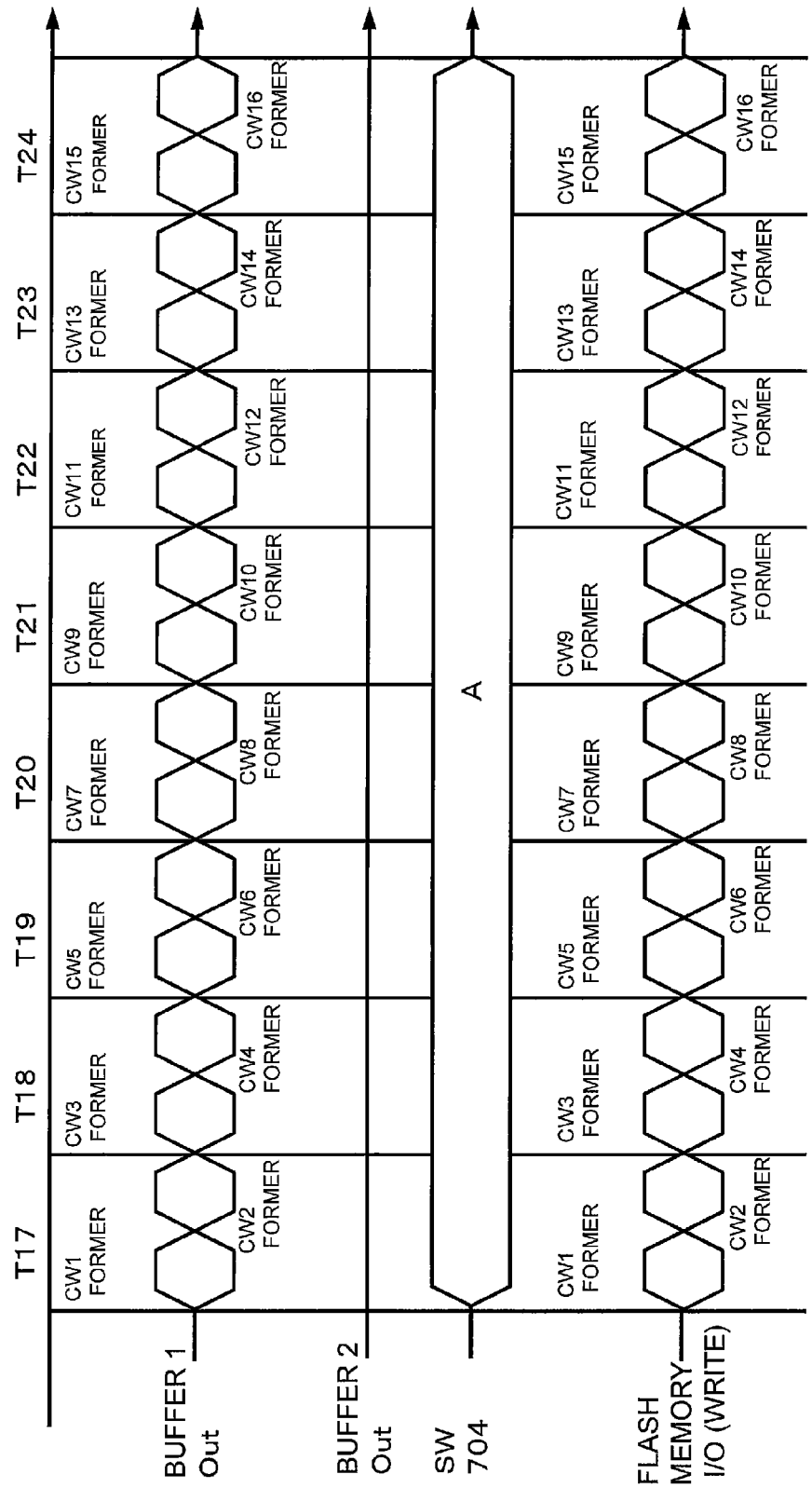
FIG. 9C is a time chart showing a timing in which data is written from a buffer to a flash memory.

FIG. 9C shows a timing in which data is written to the 2n-th page. In the present embodiment, only a former half part of the code word is stored into the 2n-th page. The data reading from the former half buffer 701 is started at a timing T17. At timings T17 to T24, the second switch 704 selects one input terminal (A). By this configuration, only a former half part of each code word for one page is written to the 2n-th page as shown in the bottom stage of FIG. 9C.

Figure 9D:
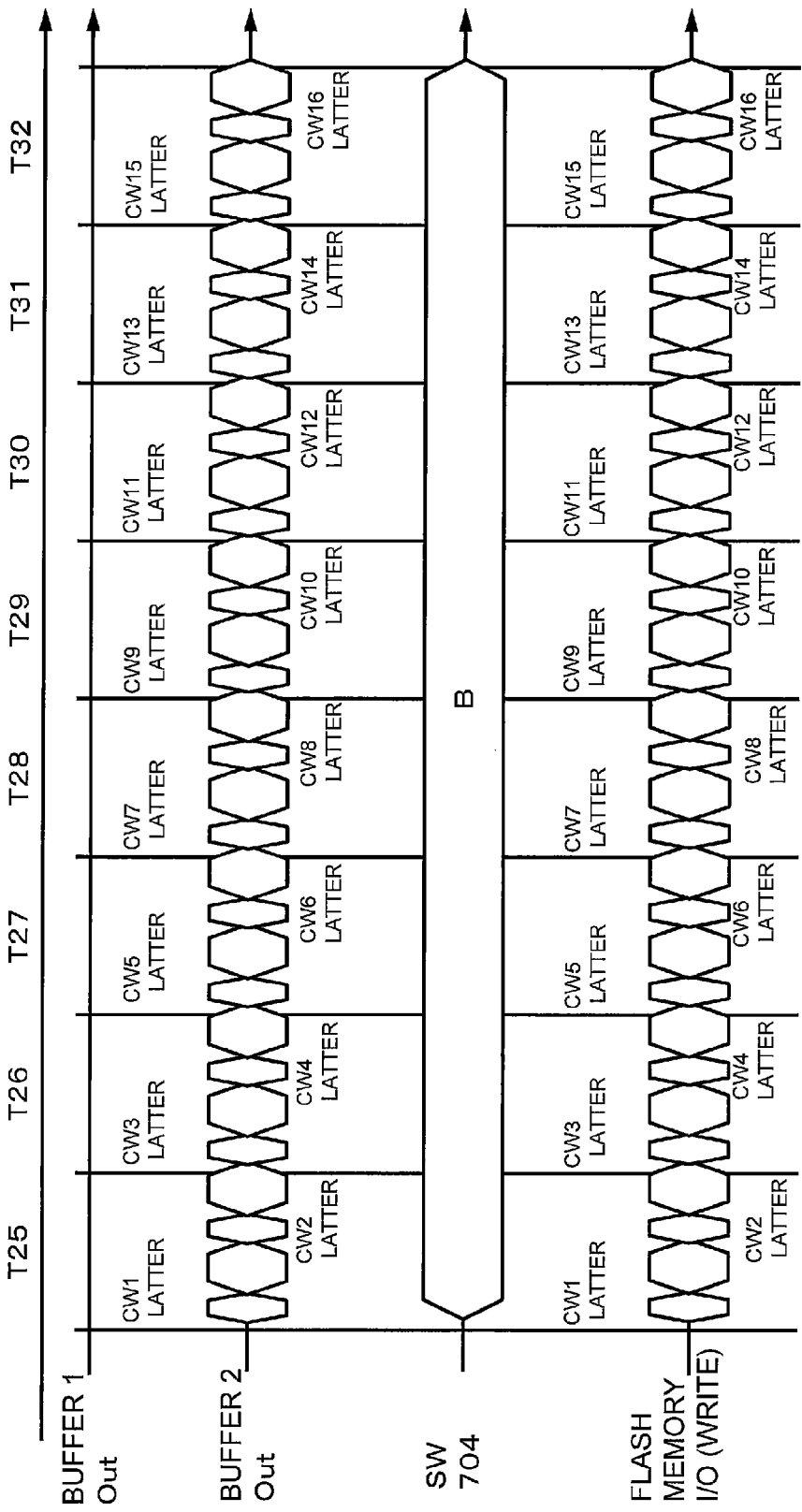
FIG. 9D is a time chart that is continuous from FIG. 9C.

FIG. 9D shows a timing in which data is written to the (2n+1)-th page. In the present embodiment, only a latter half part of the code word is stored into the other page (the (2n+1)-th page) that is continuous to the 2n-th page that stores only a former half part of the code word.

At timings T25 to T32, the second switch 704 selects the other input terminal (B). By this configuration, the data and the redundant information that have been read from the latter half buffer 702 is written to an FM of a write destination via the third switch 705.

FIG. 10A, FIG. 10B, FIG. 10C, FIG. 10D, FIG. 10E, FIG. 10F, and FIG. 10G show a case in which data is read from an FM. The following mainly describes a case an ECC error does not occur and data is read in a normal way.

In the present embodiment, the data of two pages (including the redundant information) is read from a predetermined FM to which a read is specified. A page of a read target is the 2n-th page in which only former half parts of the code words CW1 to CW16 are collected and the (2n+1)-th page in which only latter half parts of the code words CW1 to CW16 are collected. In a period in which a reading is executed from the target pages (2n and 2n+1), the third switch 705 selects one input terminal (A).

Figure 10A:
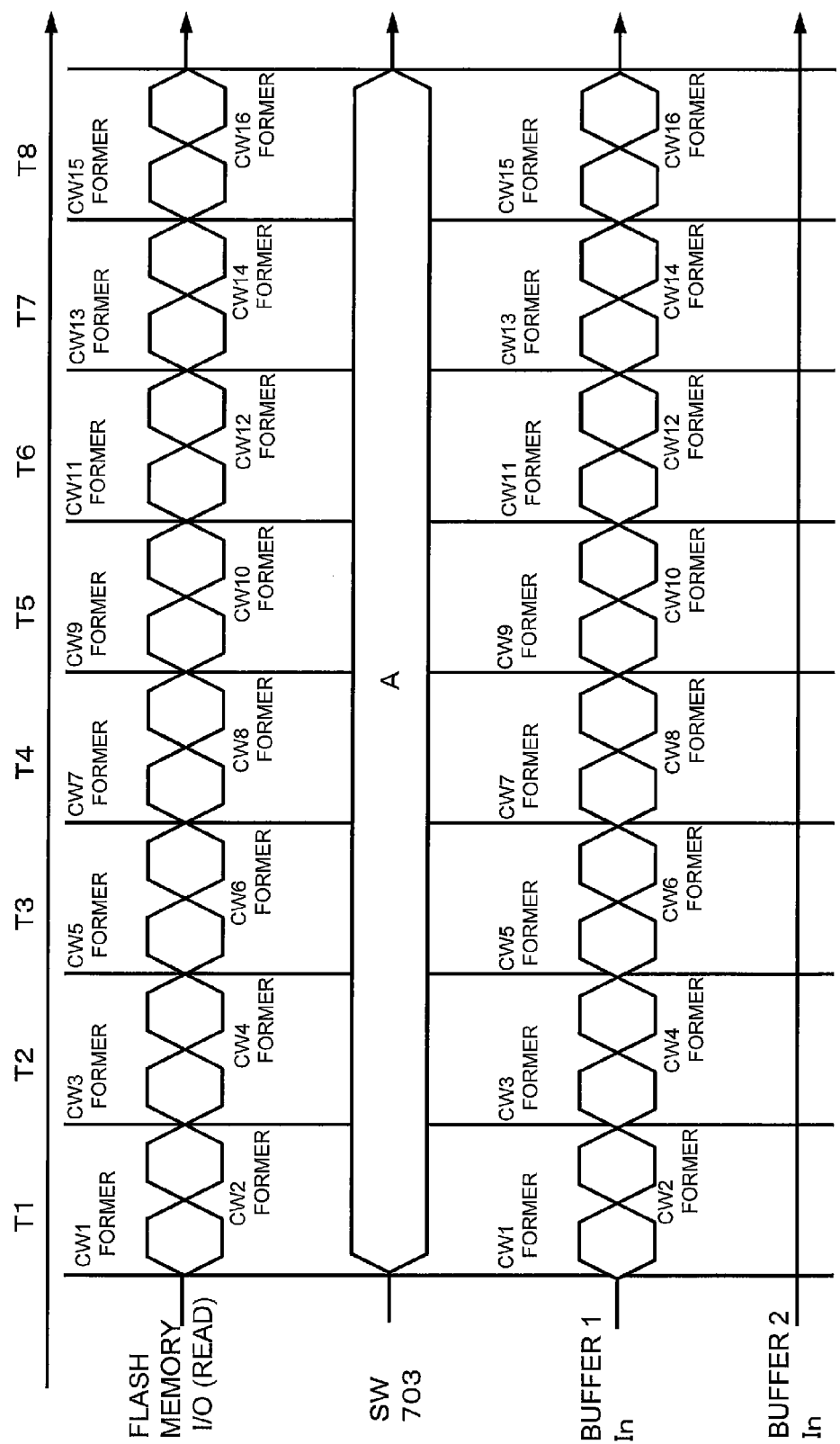
FIG. 10A is a time chart showing a timing in which data is read from a flash memory to a buffer in an ECC circuit.

In a period of the timings T1 to T8 of FIG. 10A, the first switch 703 selects one input terminal (A). By this configuration, the data that has been read from a predetermined page (the 2n-th page) in an FM of a read target is all written to the former half buffer 701.

Figure 10B:
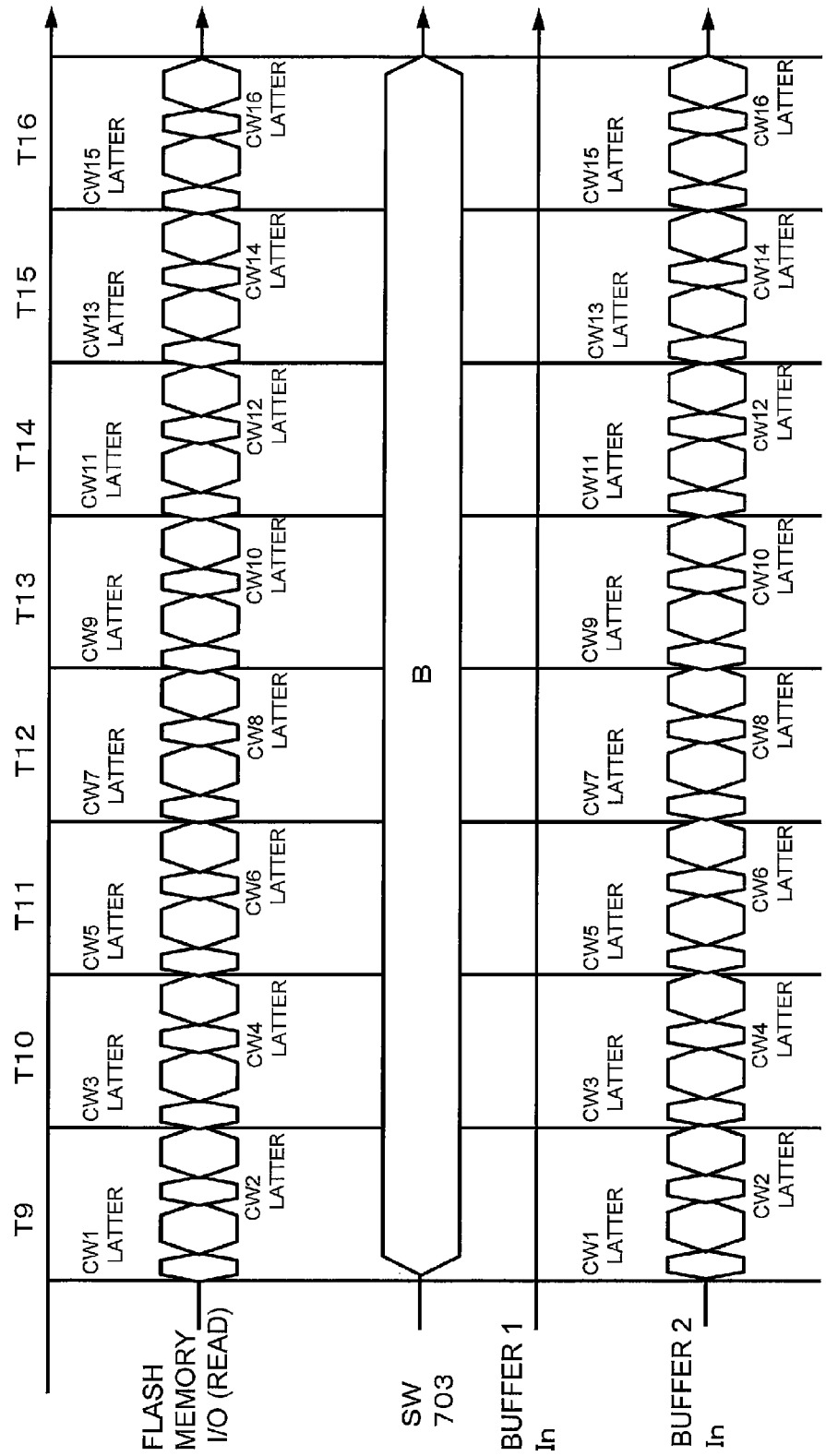
FIG. 10B is a time chart that is continuous from FIG. 10A.

In a period of the timings T9 to T16 of FIG. 10B, the first switch 703 selects the other input terminal (B). By this configuration, the data that has been read from a predetermined page (the (2n+1)-th page) in an FM of a read target is all written to the latter half buffer 702.

In the case in which a stored content of the 2n-th page is transmitted to the former half buffer 701 and a stored content of the (2n+1)-th page is transmitted to the latter half buffer 702 as described above, the data (or the redundant information) of each of the buffers 701 and 702 is transmitted to the ECC circuit 602 and the correction buffer 603 via the second switch 704, respectively.

Figure 10C:
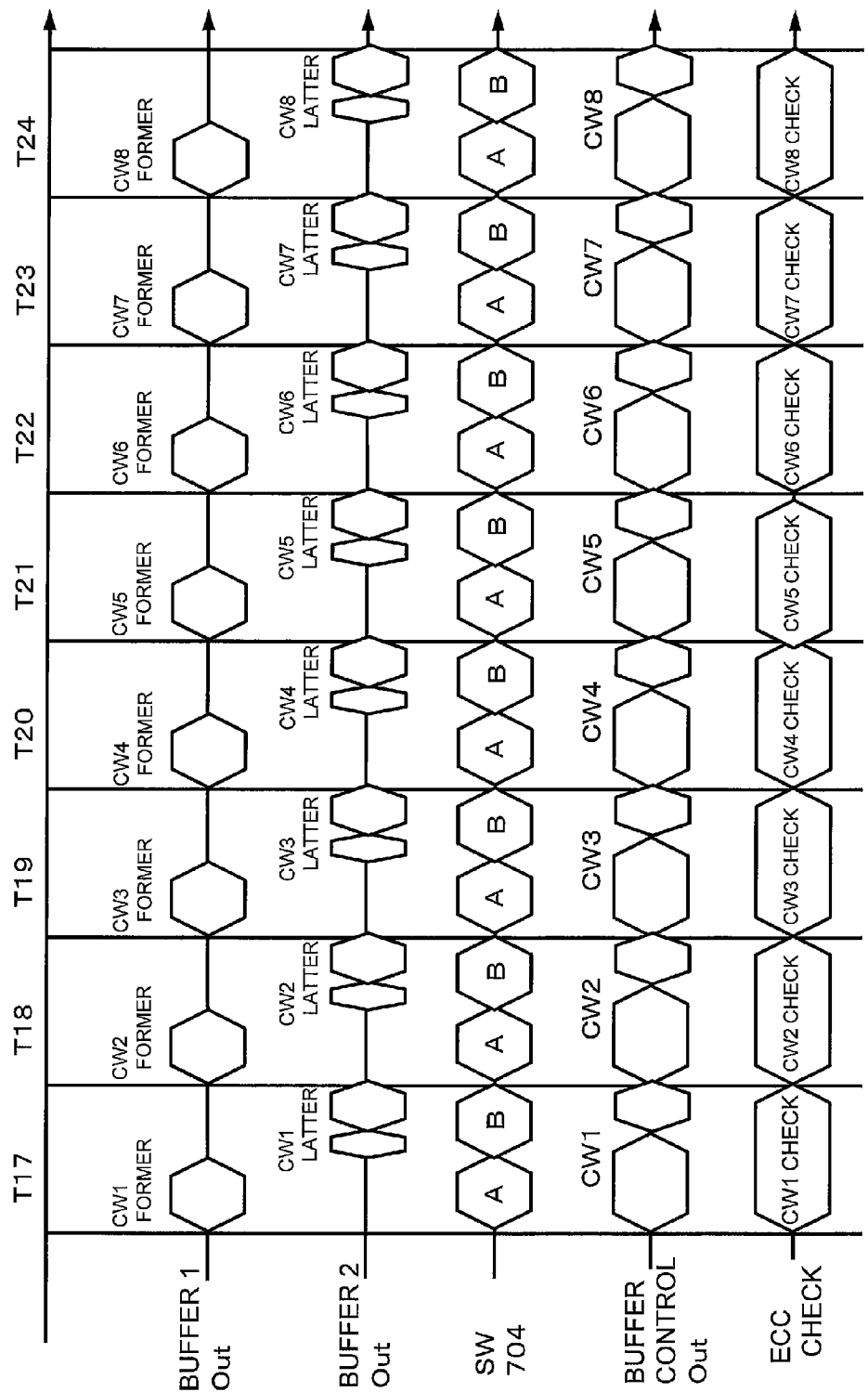
FIG. 10C is a time chart showing a timing in which data is taken from a buffer in an ECC circuit and an error check is executed.

This status is shown in FIG. 10C. The timing T17 is focused on. In the former half of the timing T17, the second switch 704 selects one input terminal (A) and reads the former half part of a code word (CW1) from the former half buffer 701. In the latter half of the timing T17, the second switch 704 selects the other input terminal (B) and reads the latter half part of a code word (CW1) from the latter half buffer 702.

The second switch 704 switches and selects the terminal (A) and the terminal (B) in a half of a unit period. By this configuration, the former half part of a code word (CW1) and the latter half part of a code word (CW1) are linked to be one piece and the code word CW1 is restored.

The code word CW1 is restored to be an original state as described above and is input to the ECC check part 612. The ECC check part 612 verifies whether or not the code word CW1 that has been input has an error.

An operation for checking whether or not a code word has an error is displayed as "check" in FIG. 10C. "CW1 check" indicates checking whether or not the code word CW1 has a bit error.

Figure 10D:
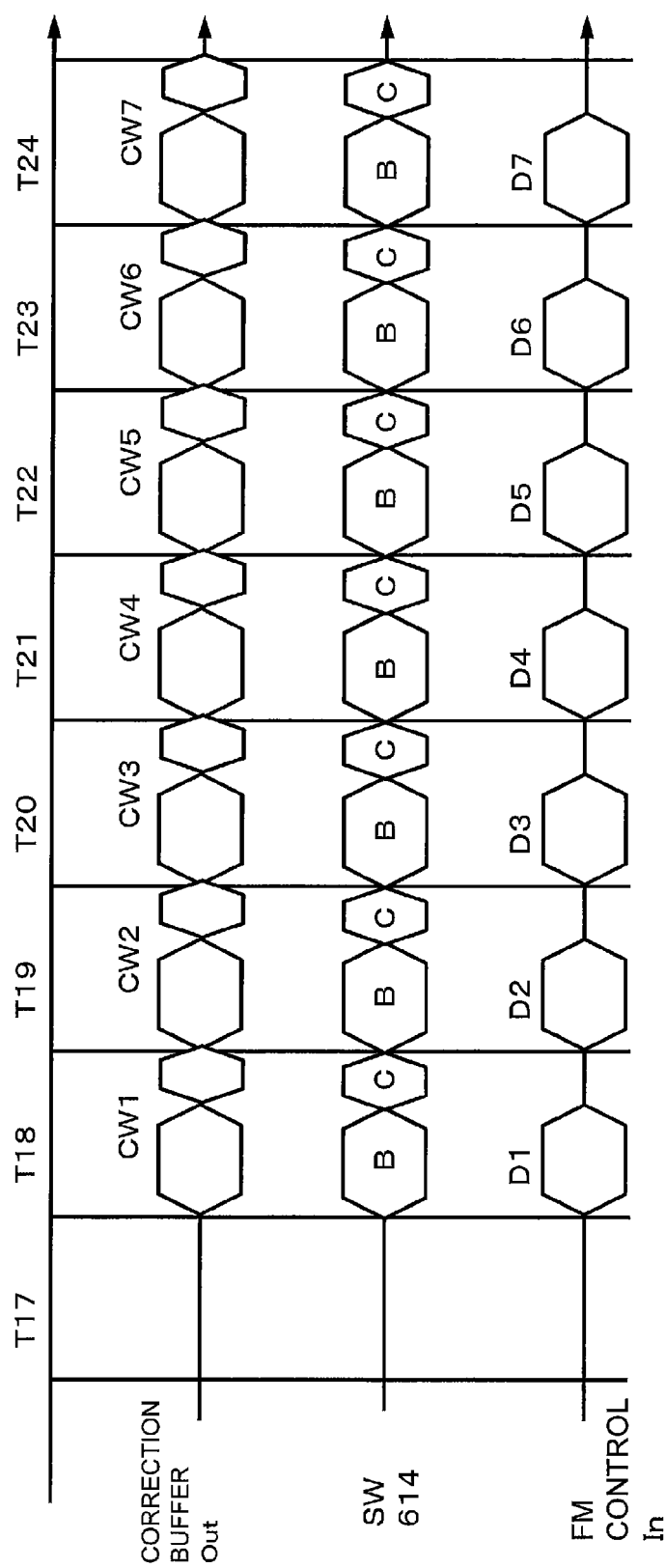
FIG. 10D is a time chart showing a timing in which the redundant information is removed from data after the check and the data is transmitted.

In the case in which an error is not detected as a result of a check as shown in FIG. 10D, a reading switch 614 shown in FIG. 7 selects the other input terminal (B) when the reading switch 614 reads a part that is corresponded to the data (DATA1) in the code word CW1 by using the checking result.

In the case in which the reading switch 614 reads a part that is corresponded to the redundant information (ECC), the reading switch 614 selects a terminal (C). By this configuration, "0" data is input to the FM control circuit 601 in a period that is corresponded to the redundant information. As a result, the redundant information (ECC1) that is unnecessary for the FM control circuit 601 is cut off.

As described above, in a period of the timings T17 to T24, an ECC check is executed for the code words CW1 to CW8. Moreover, in a period of the timings T17 to T24, the data (DATA 1 to 8) is input to the FM control circuit 601 by using the checking result.

Figure 10E:
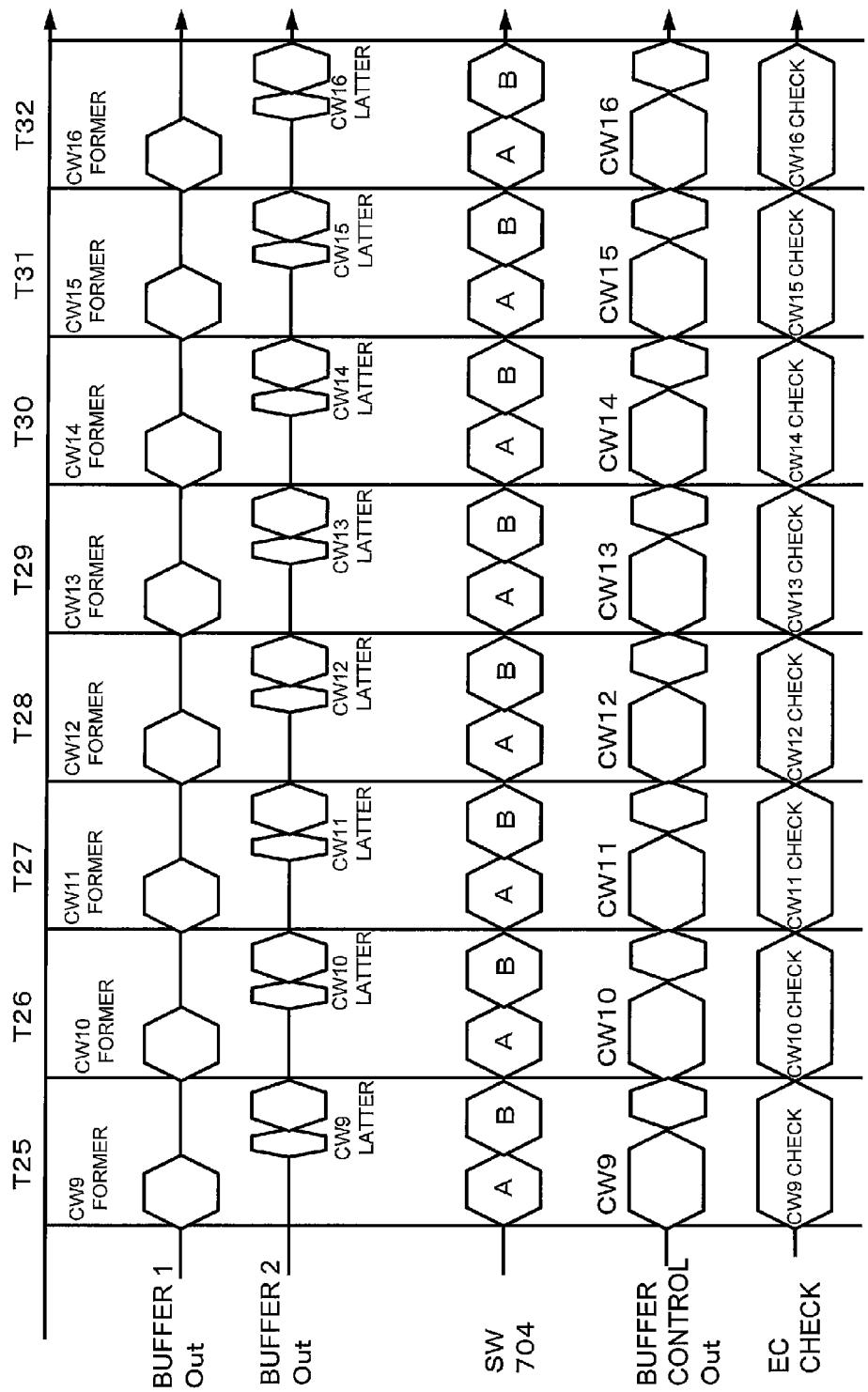
FIG. 10E is a time chart showing a timing in which data is taken from a buffer in an ECC circuit and an error check is executed.

In a period of the timings T25 to T32 of FIG. 10E similarly, the data and the redundant information that configure the code words CW9 to CW16 are read from the former half buffer 701 and the latter half buffer 702 and collected to be one piece. The ECC check part 612 then checks whether or not the code words CW9 to CW16 have an error.

Figure 10F:
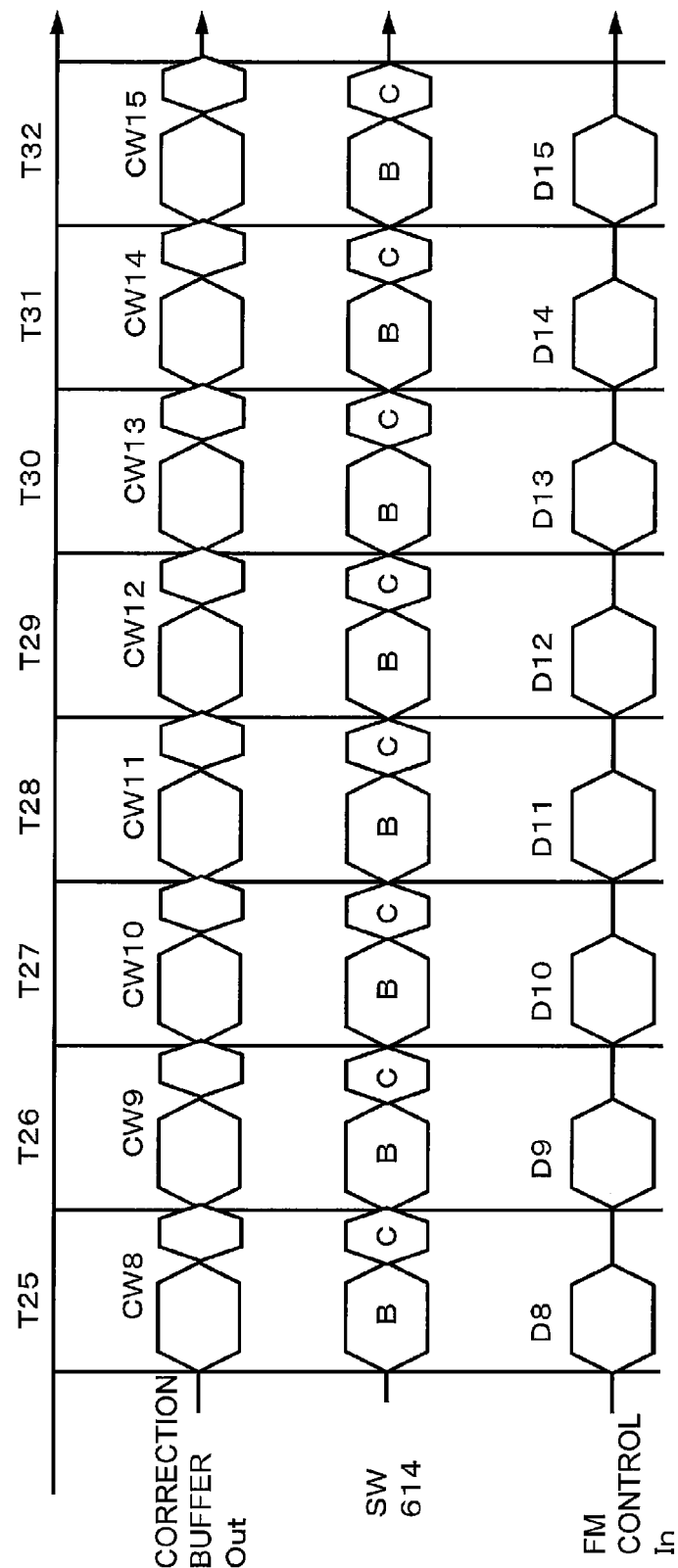
FIG. 10F is a time chart showing a timing in which the redundant information is removed from data after the check and the data is transmitted.
Figure 10G:
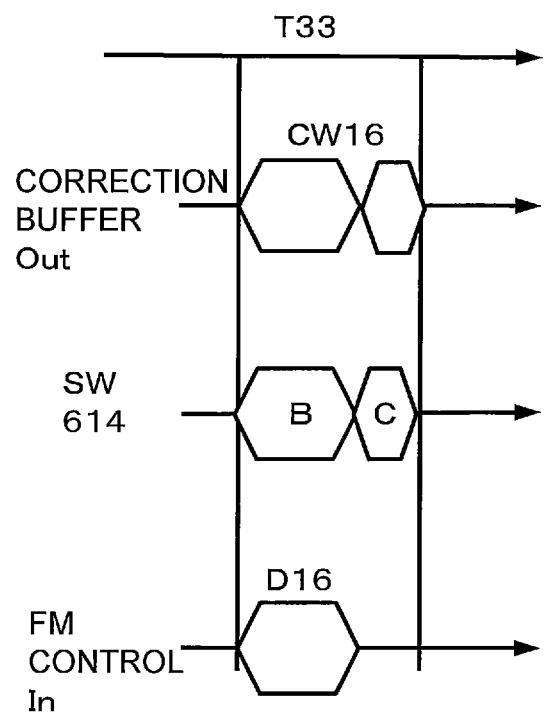
FIG. 10G is a time chart that is continuous from FIG. 10F.

Based on the checking result, the code words CW9 to CW16 are processed similarly to the code words CW1 to CW8 as shown in FIG. 10F and FIG. 10G. Only the data (DATA 9 to 16) of the code words CW9 to CW16 is input to the FM control circuit 601.

The above description is for the case in which data that has been read from an FM does not have an error. In the next place, a processing in the case in which data that has been read from an FM has an error will be described.

Figure 11A:
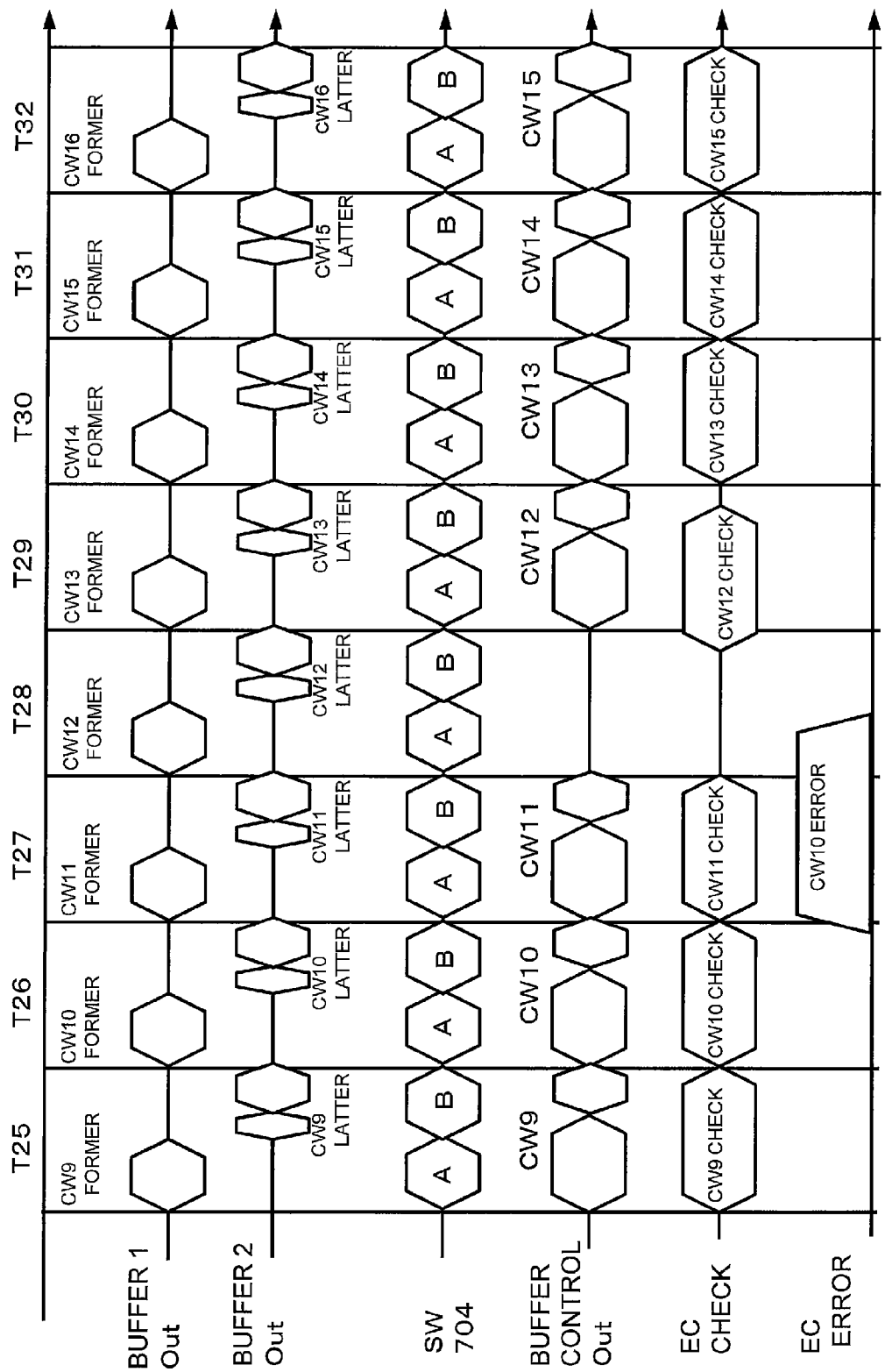
FIG. 11A is a time chart showing a case in which an error is found in the check.
Figure 11B:
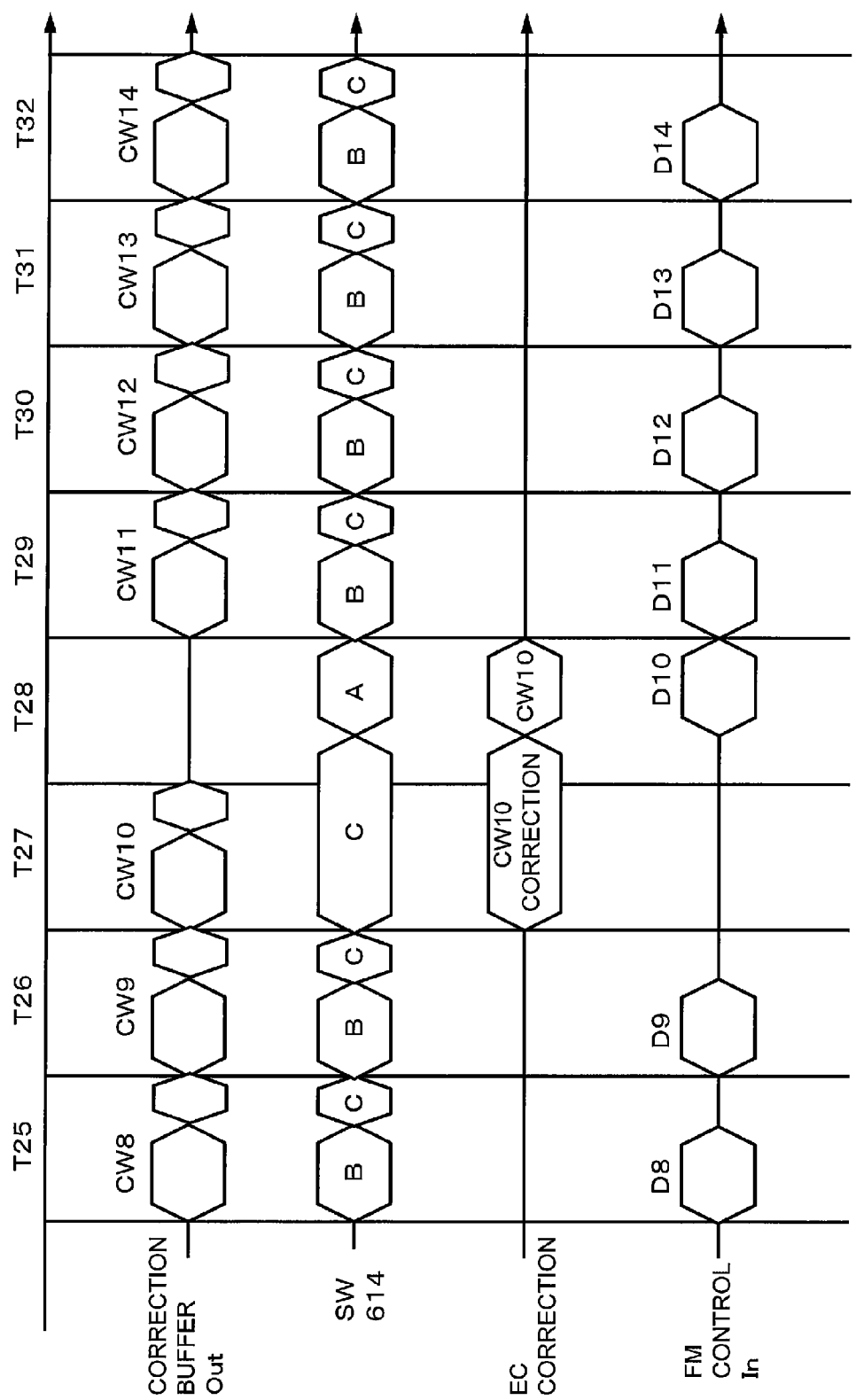
FIG. 11B is a time chart showing a timing in which an error is corrected.
Figure 11C:
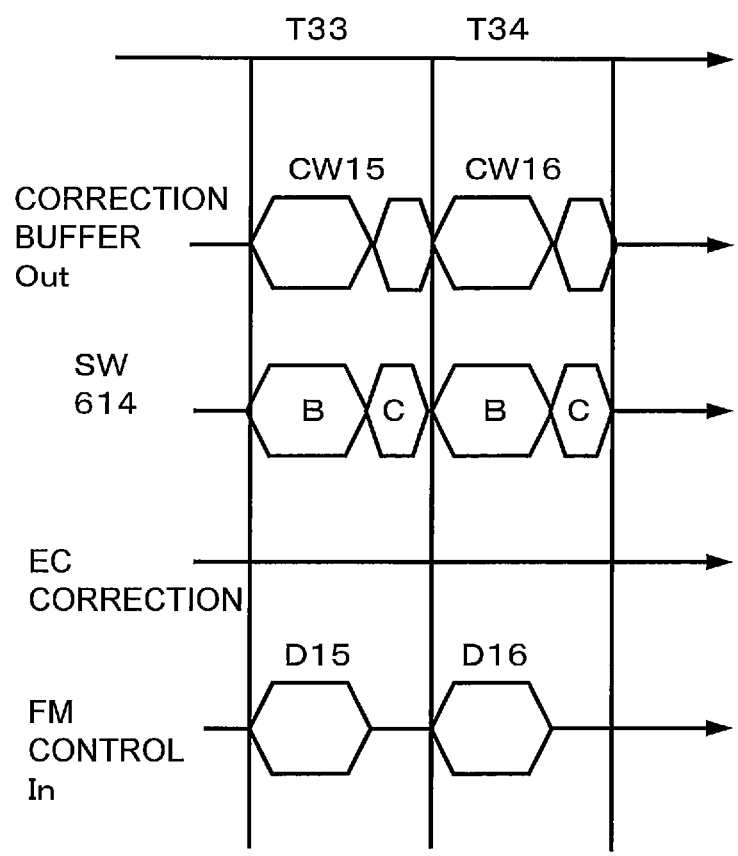
FIG. 11C is a time chart that is continuous from FIG. 11B.

FIG. 11A, FIG. 11B, and FIG. 11C show a flow in the case in which data that has been read from an FM has an abnormity and the ECC correction part corrects the data. The following describes a case an error bit exists in the code word CW10. Since a part that is corresponded to the read timings T1 to T24 has been described in FIG. 10A, FIG. 10B, FIG. 10C, and FIG. 10D, its description will be omitted. A part that is corresponded to FIG. 10E and subsequent parts will be shown in FIG. 11A and subsequent figures.

The ECC check part 612 checks whether or not a code word CW10 includes an error at the timing T26. In the case in which an error is detected in the code word CW10 as a result of the check, the ECC check part 612 outputs a status in which the code word CW10 has an error at the next timing T27.

The operation result output (a checking result) is continuously output until a correction processing of the target data (DATA 10) is completed. In the example shown in FIG. 11A, the output is continued in a period from the timing T27 to a former half of the timing T28. A time that is required for a completion of a correction processing may be longer or shorter than a time shown in FIG. 11A in some cases.

As shown in FIG. 11B, in a period in which a status in which the code word CW10 has an error is output, the reading switch 614 selects the terminal (C). By this configuration, a value "0" is input to the FM control circuit 601.

In a period in which a value "0" is output from the reading switch 614, the ECC correction part 613 reads a code word CW10 of a correction target from the correction buffer 603 and corrects an error bit. The code word CW10 in which an error has been corrected is output from the ECC check part 612 in a latter half of the timing T28.

The correct data that has been corrected is transmitted to the FM control circuit 601 in the case in which the reading switch 614 selects one terminal (A).

The timing T28 is used for a correction processing described above. From the timing T29 next to the timing in which the correction processing is completed, a processing is returned to a normal reading processing. However, in the case in which an error is detected in the code word of a read target after a processing is returned to a normal reading processing, the similar above processing is executed.

In the present embodiment that is configured as described above, a code word is written to the plurality of pages in a dispersed manner while using a technical characteristic of a nonvolatile memory in which a bit error occurrence rate is different from each other for every page. By this configuration in the present embodiment, a bit error occurrence rate that is related to a code word can be an average value of a bit error rate of a plurality of pages. As a result, it is not necessary that ECC circuits of a plurality of types are prepared, and the necessary error correction ability can be obtained only by using an ECC circuit of one type. As a result, the reliability of a nonvolatile memory can be improved without extremely increasing a manufacturing cost.

The present invention is not restricted to the embodiments described above. A person having ordinary skill in the art can carry out various changes, modifications, and functional additions without departing from the scope of the present invention. For instance, a plurality of correction buffers 603 and a plurality of ECC correction parts 613 can also be prepared. In this case, it is not necessary that one timing T28 is spent for an error correction.

REFERENCE SIGNS LIST

2000: FM module (semiconductor storage device)
2001: Higher level device
2010: Memory controller
2017 and 2017A: FM interfaces
2020 to 2028: FM (nonvolatile memories)

The invention claimed is:

1. A semiconductor storage device comprising:
a nonvolatile memory that is provided with a plurality of pages; and
a memory controller that is configured to control a read and a write of data to the nonvolatile memory,
wherein
when data is written to the nonvolatile memory, the memory controller is configured to
add redundant information that is used to correct an error for each of data of a predetermined length and store the redundant information and the data in a basic unit that is a unit of an error correction and that is configured by the data of a predetermined length into a plurality of predetermined pages among the plurality of pages in a dispersed and divided manner, wherein
the plurality of predetermined pages is selected from the plurality of pages in such a manner that an average value of a bit error occurrence rate that is included in the plurality of predetermined pages is in a predetermined range;
when data is read from the nonvolatile memory, the memory controller is configured to read the data and the redundant information that has been added to the data from the nonvolatile memory; and
when data includes an error, the memory controller is configured to correct the error based on the redundant information.

2. A semiconductor storage device according to claim 1, wherein the plurality of predetermined pages is selected as a plurality of adjacent pages.

3. A semiconductor storage device according to claim 2, wherein the memory controller is provided with one error correction circuit that is configured to detect an error for each of the data of a basic unit and to correct the error by using the redundant information.

4. A semiconductor storage device according to claim 3, wherein:
the error correction circuit is provided with a plurality of page buffers that are corresponded to the plurality of predetermined pages, and
the error correction circuit is configured to input and output data in a page unit for the plurality of predetermined pages via the plurality of page buffers.

5. A control method for a memory controller to control a read and a write of data to a nonvolatile memory that is provided with a plurality of pages, comprising the steps of:
when data is written to the nonvolatile memory, adding redundant information that is used to correct an error for each of data of a predetermined length and storing data that is in a basic unit that is a unit of an error correction and that is configured by the data of a predetermined length and the redundant information into a plurality of predetermined pages among the plurality of pages in a dispersed manner,
wherein the plurality of predetermined pages is selected from the plurality of pages in such a manner that an average value of a bit error occurrence rate that is included in the plurality of predetermined pages is in a predetermined range; and
when data is read from the nonvolatile memory, reading data and the redundant information that has been added to the data from the plurality of predetermined pages; and
when the data includes an error, correcting an error based on the redundant information to output the data.

6. A control method of a nonvolatile memory according to claim 5, wherein the plurality of predetermined pages is selected as a plurality of adjacent pages.

7. A control method of a nonvolatile memory according to claim 6, wherein the memory controller is provided with one error correction circuit that is configured to detect an error for each of the data of a basic unit and to correct the error by using the redundant information.

8. A control method of a nonvolatile memory according to claim 7, wherein:
the error correction circuit is provided with a plurality of page buffers that are corresponded to the plurality of predetermined pages, and
the error correction circuit inputs and outputs data in a page unit for the plurality of predetermined pages via the plurality of page buffers.

* * * * *